(12) United States Patent
Presman et al.

(10) Patent No.: US 10,866,857 B2
(45) Date of Patent: Dec. 15, 2020

(54) ENCODING AND DECODING OF PERMUTED CYCLIC CODES

(71) Applicant: TSOFUN ALGORITHMS LTD., Tel Aviv (IL)

(72) Inventors: Noam Presman, Givatayim (IL); Eldad Meller, Even Yehuda (IL); Alexander Smekhov, Tel Aviv (IL); Nissim Halabi, Ramat-Gan (IL)

(73) Assignee: TSOFUN ALGORITHMS LTD., Tel Aviv (IL)

( * ) Notice: Subject to any disclaimer, the term of this patent is extended or adjusted under 35 U.S.C. 154(b) by 38 days.

(21) Appl. No.: 16/155,538

(22) Filed: Oct. 9, 2018

(65) Prior Publication Data
US 2019/0108093 A1   Apr. 11, 2019

Related U.S. Application Data

(60) Provisional application No. 62/569,651, filed on Oct. 9, 2017.

(51) Int. Cl.
*G06F 11/10* (2006.01)
*G11C 29/52* (2006.01)
(Continued)

(52) U.S. Cl.
CPC ...... *G06F 11/1068* (2013.01); *G06F 11/1004* (2013.01); *G11C 29/52* (2013.01);
(Continued)

(58) Field of Classification Search
CPC .... G06F 11/1004; G11C 29/52; H03M 13/13; H03M 13/27; H03M 13/2906; H03M 13/3977; H03M 13/09
(Continued)

(56) References Cited

U.S. PATENT DOCUMENTS 6,044,485 A * 3/2000 Dent ............... H03M 13/09
714/774
6,757,122 B1 * 6/2004 Kuznetsov ......... H03M 13/1131
360/46

(Continued)

OTHER PUBLICATIONS

F.J. MacWilliams and N.J.A Sloane, "The Theory of Error-Correcting Codes", NH publishing company, 1977.
(Continued)

*Primary Examiner* — John J Tabone, Jr.
(74) *Attorney, Agent, or Firm* — Browdy and Neimark, P.L.L.C.

(57) ABSTRACT

There is provided a method of obtaining one or more parity symbols (PS) of an encoding of information symbols (IS) according to a linear cyclic code, the method comprising: upon a permutation of information symbols (IS), generating data indicative of parity coefficients of a row of a generator matrix associated with the linear cyclic code, computing, for each given parity coefficient, a first data in accordance with, at least, the given parity coefficient and the first IS; updating, by the processing circuitry, for each given parity coefficient of the one or more parity coefficients, the first data, in accordance with, at least, the given parity coefficient and the respective IS; and upon meeting a parity completion criterion for a given parity coefficient, deriving a parity symbol from the respective first data, thereby obtaining the one or more parity symbols of the codeword of the linear cyclic code.

9 Claims, 20 Drawing Sheets

(51) Int. Cl.
*H03M 13/39* (2006.01)
*H03M 13/13* (2006.01)
*H03M 13/27* (2006.01)
*H03M 13/29* (2006.01)
*H03M 13/09* (2006.01)

(52) U.S. Cl.
CPC ........... *H03M 13/13* (2013.01); *H03M 13/27* (2013.01); *H03M 13/2906* (2013.01); *H03M 13/3977* (2013.01); *H03M 13/09* (2013.01)

(58) Field of Classification Search
USPC .......................... 714/764, 758, 768, 786, 799
See application file for complete search history.

(56) References Cited

U.S. PATENT DOCUMENTS

| | | | | |
|---|---|---|---|---|
| 9,214,964 | B1* | 12/2015 | Varnica | H03M 13/2909 |
| 2003/0066014 | A1* | 4/2003 | Van Dijk | H03M 13/158 |
| | | | | 714/774 |
| 2005/0268205 | A1* | 12/2005 | Rhee | H03M 13/091 |
| | | | | 714/758 |
| 2009/0150736 | A1* | 6/2009 | Nebat | H04L 1/0084 |
| | | | | 714/748 |
| 2010/0017676 | A1* | 1/2010 | Gross | H03M 13/1171 |
| | | | | 714/752 |
| 2012/0230240 | A1* | 9/2012 | Nebat | H04L 12/1881 |
| | | | | 370/312 |
| 2019/0052412 | A1* | 2/2019 | Lopez | H04L 1/0057 |

OTHER PUBLICATIONS

T.K. Moon, "Error Correction Coding: Mathematical Methods and Algorithms", Wiley & Sons, 2005.
Blokh and Zyabolov (Blokh, E. & Zyabolov, V. "Coding of Generalized Concatenated Codes", Probl. Peredachi Inform., 1974, 10, 45-50).
Zinoviev (Zinoviev, V., "Generalized Concatenated Codes", Probl. Peredachi Inform., 1976, 12, 5-15).
Forney G. D. J., The construction of the GCCs is a generalization of Forney's code concatenation method , "Concatenated Codes", Cambridge, MA: M.I.T. Press, 1966.
I. Dumer (I. Dumer, "Concatenated Codes and Their Multilevel Generalizations", Handbook of Coding Theory, V.S. Pless & W.C. Huffman (Eds.), Elsevier, The Netherlands, 1998).
E. Arikan, "Channel polarization: A method for constructing capacity-achieving codes for symmetric binary-input memoryless channels" 2009.
Presman and Litsyn, "Recursive descriptions of polar codes". Adv. in Math. of Comm. 11(1): 1-65 (2017).
Tal and Vardy (Ido Tal and Alexander Vardy, "List Decoding of Polar Codes", IEEE Trans. Information Theory 61(5): 2213-2226 (2015)).
Seyyed Ali Hashemi, Carlo Condo and Warren J. Gross, "Fast Simplified Successive-Cancellation List Decoding of Polar Codes". CoRR abs/1701.08126 (2017).
Gabi Sarkis, Pascal Girard, Alexander Vardy, Claude Thibeault and Warren J. Gross, "Fast List Decoders for Polar Codes", IEEE Journal on Selected Areas in Communications 34(2): 318-328 (2016).
Pascal Giard, Gabi Sarkis, Alexios Balatsoukas-Stimming, YouZhe Fan, Chi-Ying Tsui, Andreas Peter Burg, Claude Thibeault, Warren J. Gross, "Hardware decoders for polar codes: An overview", ISCAS 2016: 149-152).
Cyclic redundancy check, downloaded Nov. 27, 2018, from https://en.wikipedia.org/wiki/Cyclic_redundancy_check.
CRC Polynomial Zoo, downloaded Feb. 1, 2019, from https://users.ece.cmu.edu/~koopman/crc/crc32.html.
Early terminal benefits of CRC disbribution, downloaded Nov. 27, 2018, from https://portal.3gpp.org/ngppapp/CreateTdoc.aspx?mode=view&contributionId=790248.
Design details of distributed CRC, downloaded Nov. 27, 2018, from https://portal.3gpp.org/ngppapp/CreateTdoc.aspx?mode=view&contributionId=790249.
Distributed CRC for Polar code construction, downloaded Nov. 27, 2018, from https://portal.3gpp.org/ngppapp/CreateTdoc.aspx?mode=view&contributionId=806516.
Distributed CRC for Polar code construction, downloaded Nov. 27, 2018, from https://portal.3gpp.org/ngppapp/CreateTdoc.aspx?mode=view&contributionId=802344.
On the hardware implementation of CRC interleaving, downloaded Feb. 5, 2019, from https://portal.3gpp.org/ngppapp/CreateTdoc.aspx?mode=view&contributionId=809990.

* cited by examiner

ENCODING AND DECODING OF PERMUTED CYCLIC CODES

CROSS-REFERENCES TO RELATED APPLICATIONS

The present application claims benefit from U.S. Provisional Patent Application No. 62/569,651 filed on Oct. 9, 2017, the application being hereby incorporated by reference in its entirety.

TECHNICAL FIELD

The presently disclosed subject matter relates to permuted linear cyclic error correction codes (ECCs) and, more particularly, to decoding systems for such codes or for concatenated codes utilizing them.

BACKGROUND

Problems of the encoding and decoding of linear cyclic error correction codes have been recognized in the conventional art and various techniques have been developed, see for example:
F. J. MacWilliams and N. J. A Sloane, "The Theory of Error-Correcting Codes", NH publishing company, 1977.
T. K. Moon, "Error Correction Coding: Mathematical Methods and Algorithms", Wiley & Sons, 2005.

A popular family of such codes, mainly used for error detection, are called cyclic redundancy checks (CRCs). See e.g. https://en.wikipedia.org/wiki/Cyclic_redundancy_check and https://users.ece.cmu.edu/~koopman/crc/crc32.html.

Generalized Concatenated Codes (GCC) are error correcting codes that are constructed by a technique, which was introduced by Blokh and Zyabolov (Blokh, E. & Zyabolov, V. "Coding of Generalized Concatenated Codes", Probl. Peredachi Inform., 1974, 10, 45-50) and Zinoviev (Zinoviev, V., "Generalized Concatenated Codes", Probl. Peredachi Inform., 1976, 12, 5-15). The construction of the GCCs is a generalization of Forney's code concatenation method (Forney G. D. J., "Concatenated Codes", Cambridge, Mass.: M.I.T. Press, 1966). A good survey on GCCs was authored by I. Dumer (I. Dumer, "Concatenated Codes and Their Multilevel Generalizations", Handbook of Coding Theory, V. S. Pless & W. C. Huffman (Eds.), Elsevier, The Netherlands, 1998).

Polar codes were introduced by Arikan (E. Arikan, "Channel polarization: A method for constructing capacity-achieving codes for symmetric binary-input memoryless channels"). Generalizations of polar codes and their decoding algorithms followed (see e.g. Presman and Litsyn, "Recursive descriptions of polar codes". Adv. in Math. of Comm. 11(1): 1-65 (2017)). A sequential list decoding algorithm for polar codes called successive cancellation list (SCL) was proposed by Tal and Vardy (Ido Tal and Alexander Vardy, "List Decoding of Polar Codes", IEEE Trans. Information Theory 61(5): 2213-2226 (2015)). Systems and hardware architectures for such decoders were also proposed (see e.g. Seyyed Ali Hashemi, Carlo Condo and Warren J. Gross, "Fast Simplified Successive-Cancellation List Decoding of Polar Codes". CoRR abs/1701.08126 (2017), also: Gabi Sarkis, Pascal Girard, Alexander Vardy, Claude Thibeault and Warren J. Gross, "Fast List Decoders for Polar Codes", IEEE Journal on Selected Areas in Communications 34(2): 318-328 (2016), and Pascal Giard, Gabi Sarkis, Alexios Balatsoukas-Stimming, YouZhe Fan, Chi-Ying Tsui, Andreas Peter Burg, Claude Thibeault, Warren J. Gross, "Hardware decoders for polar codes: An overview", ISCAS 2016: 149-152).

Concatenating CRC to polar codes to enhance SCL decoding was already proposed in Tal & Vardy (Op. Cit).

In a mechanism termed distributed CRC (D-CRC), the CRC outer-codeword is permuted (interleaved) before it is encoded by the polar inner code. Specifically, the bits of the CRC outer-codeword are rearranged so that CRC parity bits appear in permuted codeword as soon as mathematically possible (i.e. in lower indices) after the information bits they depend on. This approach is described in the following documents of the Third Generation Partnership Project (3GPP) and references contained therein:
R1-1708832 "Early Termination Benefits of CRC Distribution" (https://portal.3gpp.org/ngppapp/CreateTdoc.aspx?mode=view&contributionId=79024 8)
R1-1708833 "Design details of distributed CRC" (https://portal.3gpp.org/ngppapp/(CreateTdoc.aspx?mode=view&contributionId=7902 49)
R1-1712167 "Distributed CRC for Polar code construction" (https://portal.3gpp.org/ngppapp/(CreateTdoc.aspx?mode=view&contributionId=8065 16)
R1-1711539 "Distributed CRC polar code construction" (https://portal.3gpp.org/ngppapp/(CreateTdoc.aspx?mode=view&contributionId=8023 44)
R1-1713303 "On the hardware implementation of CRC interleaving" (https://portal.3gpp.org/ngppapp/(CreateTdoc.aspx?mode=view&contributionId=8099 90)

The references cited above teach background information that may be applicable to the presently disclosed subject matter. Therefore the full contents of these publications are incorporated by reference herein where appropriate, for appropriate teachings of additional or alternative details, features and/or technical background.

GENERAL DESCRIPTION

According to one aspect of the presently disclosed subject matter there is provided a computerized method of obtaining one or more parity symbols (PS) of an encoding of information symbols (IS) according to a linear cyclic code, the method comprising:
a. upon obtaining a first IS of a permutation of information symbols (IS) with associated IS indexes, generating, by a processing circuitry, data indicative of one or more parity coefficients of a row of a generator matrix associated with the linear cyclic code, the row corresponding to an IS index associated with the first IS;
b. computing, by the processing circuitry, for each given parity coefficient of the one or more parity coefficients, a first data in accordance with, at least, the given parity coefficient and the first IS;
c. for each next IS of the permutation,
generating, by the processing circuitry, data indicative of one or more parity coefficients of a generator matrix row corresponding to the IS index;
updating, by the processing circuitry, for each given parity coefficient of the one or more parity coefficients, the first data, in accordance with, at least, the given parity coefficient and the respective IS; and
d. upon meeting a parity completion criterion for a given parity coefficient, deriving a parity symbol from the respective first data, thereby obtaining the one or more parity symbols of the codeword of the linear cyclic code.

The method according to this aspect of the presently disclosed subject matter can further comprise one or more of features (i) to (vi) listed below, in any desired combination or permutation which is technically possible:

(i) additionally comprising:
  e. subsequent to the deriving a parity symbol, performing at least one of:
    transmitting the PS,
    comparing the PS to a received value, thereby evaluating
    correctness of at least one of the ISes; and
    correcting at least one IS;
(ii) wherein the computing data usable for deriving a parity symbol comprises multiplying the information symbol by the parity coefficient
(iii) wherein the updating the data usable for deriving a parity symbol comprises adding the result of multiplying the information symbol by the parity coefficient.
(iv) wherein the permutation of information symbols are comprised in a candidate codeword resulting from sequential list decoding of an inner code, the method additionally comprising:
  e. subsequent to deriving a PS, comparing the PS to a received value, thereby evaluating correctness of the candidate codeword; and
  f. according to the correctness of the candidate codeword, performing one of: invalidating the candidate codeword, accepting the candidate codeword.
(v) wherein the linear cyclic code is a cyclic redundancy check.
(vi) wherein the inner code is a polar code.

According to another aspect of the presently disclosed subject matter there is provided a decoder configured to perform decoding of a linear cyclic code, the decoder comprising a processing circuitry, wherein the decoder is configured to perform a computerized method of obtaining one or more parity symbols (PS) of an encoding of information symbols (IS) according to a linear cyclic code, the method comprising:
  a. upon obtaining a first IS of a permutation of information symbols (IS) with associated IS indexes, generating, by a processing circuitry, data indicative of one or more parity coefficients of a row of a generator matrix associated with the linear cyclic code, the row corresponding to an IS index associated with the first IS;
  b. computing, by the processing circuitry, for each given parity coefficient of the one or more parity coefficients, a first data in accordance with, at least, the given parity coefficient and the first IS;
  c. for each next IS of the permutation,
    generating, by the processing circuitry, data indicative of one or more parity coefficients of a generator matrix row corresponding to the IS index;
    updating, by the processing circuitry, for each given parity coefficient of the one or more parity coefficients, the first data, in accordance with, at least, the given parity coefficient and the respective IS; and
  d. upon meeting a parity completion criterion for a given parity coefficient, deriving a parity symbol from the respective first data, thereby obtaining the one or more parity symbols of the codeword of the linear cyclic code.

According to another aspect of the presently disclosed subject matter there is provided an encoder configured to perform encoding of a linear cyclic code, the decoder comprising a processing circuitry, wherein the encoder is configured to perform a computerized method of obtaining one or more parity symbols (PS) of an encoding of information symbols (IS) according to a linear cyclic code, the method comprising:
  a. upon obtaining a first IS of a permutation of information symbols (IS) with associated IS indexes, generating, by a processing circuitry, data indicative of one or more parity coefficients of a row of a generator matrix associated with the linear cyclic code, the row corresponding to an IS index associated with the first IS;
  b. computing, by the processing circuitry, for each given parity coefficient of the one or more parity coefficients, a first data in accordance with, at least, the given parity coefficient and the first IS;
  c. for each next IS of the permutation,
    generating, by the processing circuitry, data indicative of one or more parity coefficients of a generator matrix row corresponding to the IS index;
    updating, by the processing circuitry, for each given parity coefficient of the one or more parity coefficients, the first data, in accordance with, at least, the given parity coefficient and the respective IS; and
  d. upon meeting a parity completion criterion for a given parity coefficient, deriving a parity symbol from the respective first data, thereby obtaining the one or more parity symbols of the codeword of the linear cyclic code.

According to another aspect of the presently disclosed subject matter there is provided a non-transitory program storage device readable by a processing circuitry, tangibly embodying computer readable instructions executable by the processing circuitry to perform a method of obtaining one or more parity symbols (PS) of an encoding of information symbols (IS) according to a linear cyclic code, the method comprising:
  a. upon obtaining a first IS of a permutation of information symbols (IS) with associated IS indexes, generating, by a processing circuitry, data indicative of one or more parity coefficients of a row of a generator matrix associated with the linear cyclic code, the row corresponding to an IS index associated with the first IS;
  b. computing, by the processing circuitry, for each given parity coefficient of the one or more parity coefficients, a first data in accordance with, at least, the given parity coefficient and the first IS;
  c. for each next IS of the permutation,
    generating, by the processing circuitry, data indicative of one or more parity coefficients of a generator matrix row corresponding to the IS index;
    updating, by the processing circuitry, for each given parity coefficient of the one or more parity coefficients, the first data, in accordance with, at least, the given parity coefficient and the respective IS; and
  d. upon meeting a parity completion criterion for a given parity coefficient, deriving a parity symbol from the respective first data, thereby obtaining the one or more parity symbols of the codeword of the linear cyclic code.

According to one aspect of the presently disclosed subject matter there is provided a computerized method of obtaining one or more parity symbols (PS) of an encoding of information symbols (IS) according to a linear cyclic code, the method comprising:
  a. upon obtaining a first IS segment of a permutation of the sequence of IS, computing, by the processing circuitry, at least one first data value in accordance with, at least, a first sparse information symbol vector and the linear cyclic code, wherein the IS segment comprises one or more IS ordered according to the ordering of the sequence of IS, and wherein the first sparse information symbol vector comprises the sequence of IS wherein IS that are not in the first IS segment are replaced by zero;

b. for a next IS segment of the permutation:
updating, by the processing circuitry, the at least one first data value, in accordance with, at least, a next sparse information symbol vector and the linear cyclic code, wherein the next sparse information symbol vector comprises the sequence of IS wherein IS that are not in the next IS segment are replaced by zero;

c. repeating operation b) until meeting a parity completion criterion for a given parity symbol, thereby obtaining a final data value; and d. deriving the given parity symbol from the final data value.

The method according to this aspect of the presently disclosed subject matter can further comprise one or more of features (i) to (ii) listed below, in any desired combination or permutation which is technically possible:

(i) wherein the computing at least one first data value comprises:
computing at least one parity symbol of the linear cyclic code codeword comprising the information symbols of the sparse information symbol vector.

(ii) wherein the computing at least one parity symbol of the linear cyclic code codeword comprises:
a) upon obtaining a first information symbol and data indicative of an associated information symbol index difference, computing, by the processing circuitry, a first data value according to, at least, the first information symbol, the information symbol index difference, and the linear cyclic code, thereby giving rise to a current intermediate data value;
b) for a next information symbol and data indicative of an associated information symbol index difference, computing a next data value according to, at least, the first information symbol, the information symbol index difference, the current intermediate data value and the linear cyclic code, thereby giving rise to a revised current intermediate data value;
c) repeating operation b) for each IS in the IS segment, thereby giving rise to a final data value;
d) deriving at least one parity symbol from the final data value.

According to another aspect of the presently disclosed subject matter there is provided an encoder configured to perform encoding of a linear cyclic code, the decoder comprising a processing circuitry, wherein the encoder is configured to perform a computerized method of obtaining one or more parity symbols (PS) of an encoding of information symbols (IS) according to a linear cyclic code, the method comprising:

a. upon obtaining a first IS segment of a permutation of the sequence of IS, computing, by the processing circuitry, at least one first data value in accordance with, at least, a first sparse information symbol vector and the linear cyclic code, wherein the IS segment comprises one or more IS ordered according to the ordering of the sequence of IS, and wherein the first sparse information symbol vector comprises the sequence of IS wherein IS that are not in the first IS segment are replaced by zero;

b. for a next IS segment of the permutation:
updating, by the processing circuitry, the at least one first data value, in accordance with, at least, a next sparse information symbol vector and the linear cyclic code, wherein the next sparse information symbol vector comprises the sequence of IS wherein IS that are not in the next IS segment are replaced by zero;

c. repeating operation b) until meeting a parity completion criterion for a given parity symbol, thereby obtaining a final data value; and d. deriving the given parity symbol from the final data value.

According to another aspect of the presently disclosed subject matter there is provided a non-transitory program storage device readable by a processing circuitry, tangibly embodying computer readable instructions executable by the processing circuitry to perform a method of obtaining one or more parity symbols (PS) of an encoding of information symbols (IS) according to a linear cyclic code, the method comprising:

a. upon obtaining a first IS segment of a permutation of the sequence of IS, computing, by the processing circuitry, at least one first data value in accordance with, at least, a first sparse information symbol vector and the linear cyclic code, wherein the IS segment comprises one or more IS ordered according to the ordering of the sequence of IS, and wherein the first sparse information symbol vector comprises the sequence of IS wherein IS that are not in the first IS segment are replaced by zero;

b. for a next IS segment of the permutation:
updating, by the processing circuitry, the at least one first data value, in accordance with, at least, a next sparse information symbol vector and the linear cyclic code, wherein the next sparse information symbol vector comprises the sequence of IS wherein IS that are not in the next IS segment are replaced by zero;

c. repeating operation b) until meeting a parity completion criterion for a given parity symbol, thereby obtaining a final data value; and d. deriving the given parity symbol from the final data value.

Among the advantages of certain embodiments of the presently disclosed subject matter are reduced latency and reduced power consumption in encoding and decoding.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "representing", "comparing", "generating", "evaluating", "determining", "matching", "updating" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the processing circuitry, "processor", "controller", "control unit", "shift register", "adder", "multiplier", "encoder", and "decoder" disclosed in the present application.

The terms "non-transitory memory" and "non-transitory storage medium" used herein should be expansively construed to cover any volatile or non-volatile computer memory suitable to the presently disclosed subject matter.

The operations in accordance with the teachings herein may be performed by a computer specially constructed for the desired purposes or by a general-purpose computer specially configured for the desired purpose by a computer program stored in a non-transitory computer-readable storage medium.

Embodiments of the presently disclosed subject matter are not described with reference to any particular programming language. It will be appreciated that a variety of programming languages may be used to implement the teachings of the presently disclosed subject matter as described herein.

Figure 1:
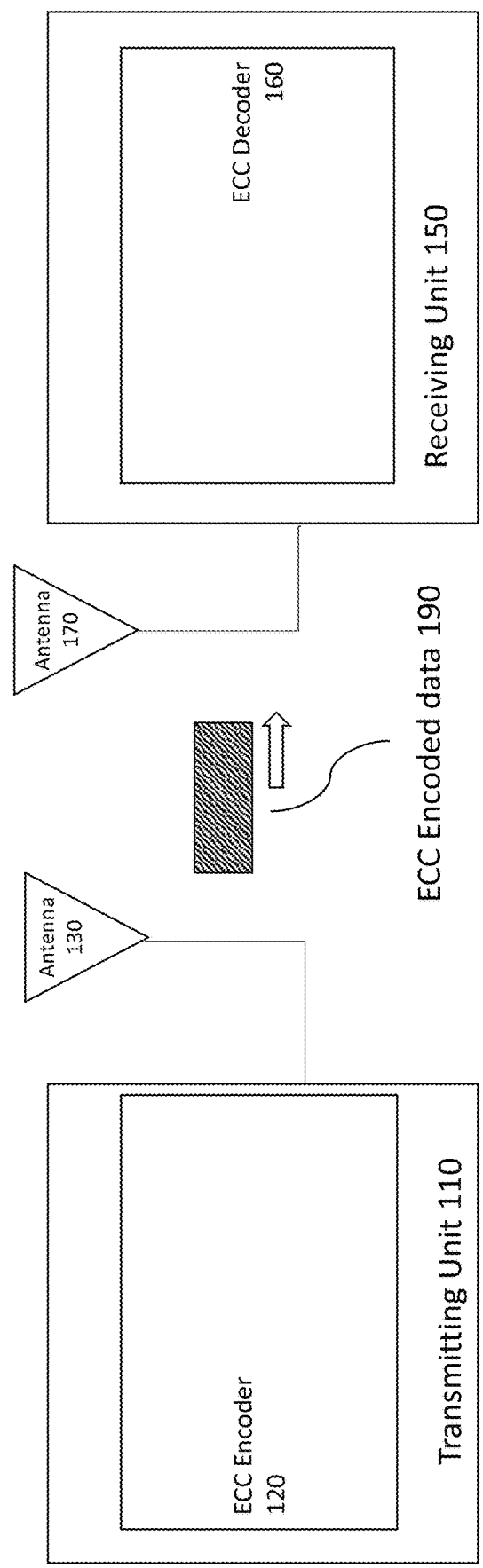
FIG. 1 is a block diagram of a wireless communications network employing an Error Correction Code (ECC) Decoder configured in accordance with certain embodiments of the presently disclosed subject matter.

Bearing this in mind, attention is drawn to FIG. 1 illustrating a block diagram of a wireless communications network employing an Error Correction Code (ECC) Decoder configured in accordance with certain embodiments of the presently disclosed subject matter.

The system includes a transmitting unit (110) configured to communicate wirelessly with a receiving unit (150). Wireless communication between transmitting unit (110) and receiving unit (150) can utilize, for example, a cellular technology capable of carrying, for example, data packets, and the wireless signal can be transmitted via antenna (130) and received over antenna (170). The wireless signal can carry, for example, packets such as the ECC encoded data (190) packet.

The wireless signal can be affected by signal dissipation and various kinds of electromagnetic interference which can result in errors occurring in the data received at the receiving unit (150). By encoding using an Error Correction Code (such as Arikan's polar code) at the transmitter and then decoding at the receiver, such errors can be corrected. The communication system of FIG. 1 can thus be more resistant to interference and less error-prone than a system that does not use an ECC.

The transmitting unit (110) can contain an ECC encoder (120). The ECC encoder (120) processes the data that arrives for transmission to the receiving unit (150) (known as the information word), and can process it according to an Error Correction Code (resulting in a codeword) before transmission. Similarly, the receiving unit (150) can contain an ECC decoder (160). The ECC decoder (160) can process the codeword that arrives at the receiving unit (150) from the transmitting unit (110) (such as the ECC encoded data (190)), and can process it according to the Error Correction Code used at the ECC encoder (120) to restore the original information word.

In some embodiments of the presently disclosed subject matter, the system illustrated in FIG. 1 can utilize a concatenated error correction code as its ECC. A concatenated error correction code can consist of an outer ECC (applied, for example, first when encoding data) and an inner ECC (on encoding: applied, for example, to the output resulting from the encoding with the outer code). On decoding, the inner ECC can be, for example, decoded first. By way of non-limiting example, the outer code can be a linear cyclic code such as a cyclic redundancy check (CRC) and the inner code can be a polar code. The term "linear cyclic code" shall herein be construed to include both linear cyclic codes and shortened linear cyclic codes as appropriate.

In some embodiments of the presently disclosed subject matter, the ECC encoder (120)—for example—can reorder the symbols of an outer code codeword before encoding them with the inner code and then transmitting them (for example, to reduce the impact of burst noise). Such a reordering is herein termed a permutation of the codeword. In such cases, the ECC decoder (160) can, for example, be configured to restore the original order of the symbols (for example: after the decoding).

In some embodiments of the presently disclosed subject matter, a codeword of a linear cyclic code outer-code can be permuted in a manner wherein one or more of the parity symbols are interleaved with the information symbols.

In linear cyclic codes, certain parity symbols can be shown mathematically to depend only on a subset of the information symbols (cf. section 2.1 of "Design details of distributed CRC" op. cit by way of non-limiting example). In some embodiments of the presently disclosed subject matter, a codeword can be permuted such that, for example, an interleaved parity symbol appears in the codeword subsequent to the last information symbol upon which the parity symbol depends. Such a permutation is herein termed a "distributed parity" permutation.

It is noted that the teachings of the presently disclosed subject matter are not bound by the wireless communications system described with reference to FIG. 1. Equivalent and/or modified functionality can be consolidated or divided in another manner and can be implemented in any appropriate combination of software with firmware and/or hardware and executed on a suitable device. The wireless communications system can be a standalone network entity, or integrated, fully or partly, with other network entities. It will be clear to one skilled in the art how an ECC decoder can be employed in other embodiments such as wired communication, storage systems etc.

Figure 2:
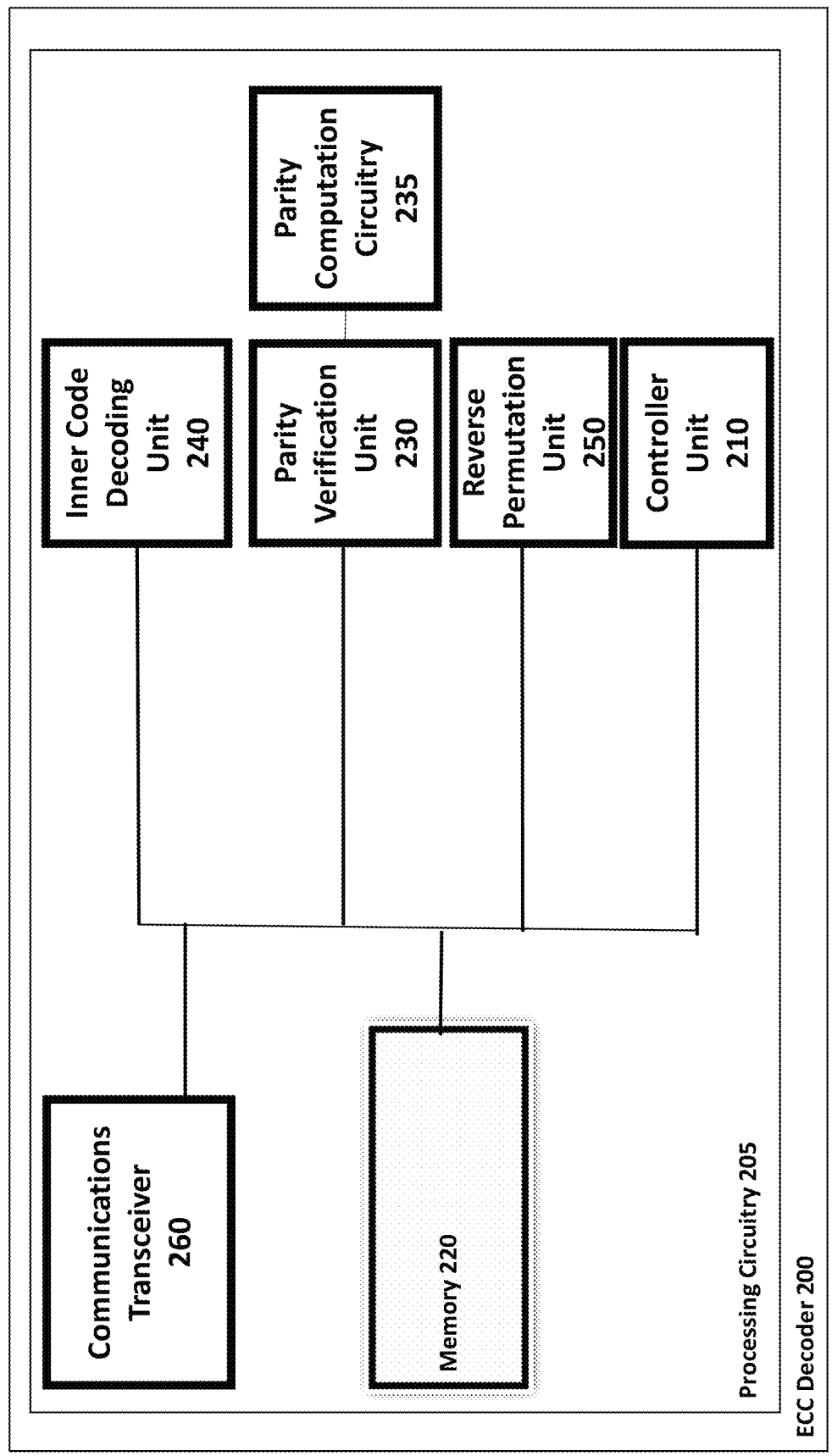
FIG. 2 is a block diagram of an exemplary Error Correction Code (ECC) decoder and its components according to some embodiments of the presently disclosed subject matter.

FIG. 2 is a block diagram of an exemplary Error Correction Code (ECC) decoder (200) and its components according to some embodiments of the presently disclosed subject matter.

The ECC Decoder (200) can include a processing circuitry (205) which itself can include a controller unit (210) operatively coupled to a memory (220).

A controller unit (210) can be a hardware-based electronic device with data processing capabilities, such as, for example, a general purpose processor, a specialized Application Specific Integrated Circuit (ASIC), one or more cores in a multicore processor etc. A controller unit (210) can also consist, for example, of multiple processors, multiple ASICs, virtual processors, combinations thereof etc.

The controller unit (210) can be configured to, for example, receive a codeword of a particular Error Correction Code over an external interface (not shown) via, for example, a communications transceiver (260), and store it to, for example, memory (220). The controller unit (210) can subsequently, for example, initiate and orchestrate a sequence of steps to decode the codeword so that, for example, an estimation of the original codeword (i.e. an estimation of the word as initially supplied to the encoder unit (120)) is available in the memory (220).

The memory (220) can be, for example, any kind of volatile or non-volatile storage, and can include, for example, a single physical memory component or a plurality of physical memory components. The memory (220) can be additionally configured to, for example, store various data used in the computation of a decoded codeword.

As will be further detailed hereinbelow with reference to FIG. 9, the processing circuitry (205) can be configured to, for example, execute several functional modules in accordance with computer-readable instructions implemented on a non-transitory computer-readable storage medium. Such functional modules are referred to hereinafter as comprised in the processing circuitry. These modules can include, for example, inner code decoding unit (240), parity verification unit (230), parity computation circuitry (235), and reverse permutation unit (250).

The inner code decoding unit (240), can, for example, generate candidate (i.e. corrected) codewords (for example: from symbol data received by the receiving unit (150))—according to the inner code of a concatenated code utilized by the ECC decoder (200).

Parity verification unit (230) can then, for example, process the generated candidate codewords that are output by the inner code decoding unit (240). Specifically, if the outer code utilized is a linear cyclic code including parity symbols, then the parity verification unit (230) can invoke, for example, parity computation circuitry (235) to compute the parity symbols of linear cyclic code from the information symbols of a candidate codeword. The parity verification unit (230) can then compare the computed parity symbols with the received parity symbols to determine whether the codeword contains errors. ECC Decoder (200) (for example: controller unit 210) can then, for example, discard a candidate codeword containing errors It is noted that inner code decoding unit (240) can perform, for example, a successive cancellation list (SCL) decoding algorithm. It is further noted that inner code decoding unit (240) can itself perform, for example, concatenated decoding. By way of non-limiting example, inner code decoding unit (240) can implement the concatenated-code based successive cancellation list decoding algorithm described in Presman, "Recursive Descriptions of Polar Codes" op. cit Parity computation circuitry (235) can be, for example, specialized circuitry utilized by, for example, the parity verification unit (230) to perform computation of the parity symbols of the linear cyclic code. Certain embodiments of the parity computation circuitry (235) are further described hereinbelow. Parity computation circuitry (235) can be operably connected to parity verification unit (230) and memory (220). It is noted that in some embodiments of the presently disclosed subject matter the inner code decoding and outer code decoding methods can operate, for example, sequentially (so that inner code decoding completes before outer code decoding begins), or in an integrated manner (as described hereinbelow with reference to FIG. 9).

In some embodiments of the presently disclosed subject matter, symbols received by the receiving unit (150) from the transmitted unit (110) can be permutations of the outer-code codeword symbols generated at the ECC encoder (120). In such embodiments, parity computation circuitry (235) can, for example, be configured to compute parity symbols according to the permuted order in which the codeword information symbols are received—as will be described in detail hereinbelow with reference to FIGS. 7-8 and FIG. 13. In such embodiments, reverse permutation unit (250) can, for example, subsequently restore the original order of the received symbols for use by, for example, a data application (not shown).

In some embodiments of the presently disclosed subject matter, an estimation of the original information word (i.e. an estimation of the word as passed initially into the encoder unit (120)) can be available in the memory (220) upon completion of the decoding. This process is further described below with reference to FIG. 9.

It is noted that the teachings of the presently disclosed subject matter are not bound by the ECC encoder described with reference to FIG. 2. Equivalent and/or modified functionality can be consolidated or divided in another manner and can be implemented in any appropriate combination of software with firmware and/or hardware and executed on a suitable device.

Figure 3:
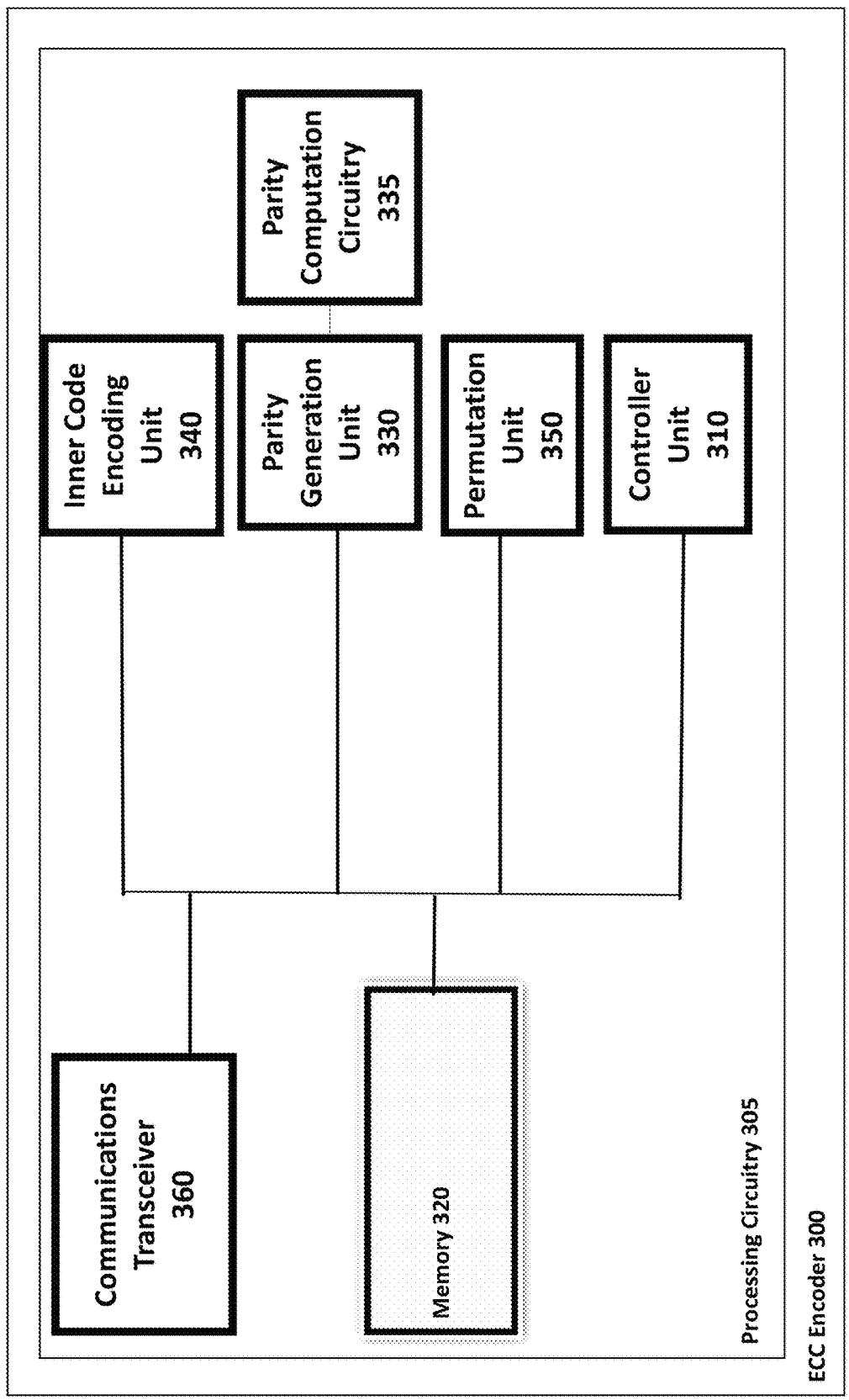
FIG. 3 is a block diagram of an exemplary Error Correction Code (ECC) encoder (300) and its components, according to some embodiments of the presently disclosed subject matter.

FIG. 3 is a block diagram of an exemplary Error Correction Code (ECC) encoder (300) and its components, according to some embodiments of the presently disclosed subject matter.

The ECC encoder (300) can include a processing circuitry (305) which itself can include a controller unit (310) operatively coupled to a memory (320).

A controller unit (310) can be a hardware-based electronic device with data processing capabilities, such as, for example, a general purpose processor, a specialized Application Specific Integrated Circuit (ASIC), one or more cores in a multicore processor etc. A controller unit (310) can also consist, for example, of multiple processors, multiple ASICs, virtual processors, combinations thereof etc.

The controller unit (310) can be configured to, for example, receive an instruction from—for example—an application (not shown) instructing the controller (310) to—for example—permute, encode and transmit symbol data residing in for example, memory (320). The controller unit (310) can be configured to, for example, subsequently initiate and orchestrate a sequence of steps to carry out the permuting, encoding, and transmission of a codeword based on the symbol data.

The memory (320) can be, for example, any kind of volatile or non-volatile storage, and can include, for example, a single physical memory component or a plurality of physical memory components. The memory (320) can be additionally configured to, for example, store various data used in the preparation of a codeword for transmission.

The processing circuitry (305) can be configured to, for example, execute several functional modules in accordance with computer-readable instructions implemented on a non-transitory computer-readable storage medium. Such functional modules are referred to hereinafter as comprised in the processing circuitry. These modules can include, for example, parity generation unit (330), permutation unit (350), inner code encoding unit (340), as well as parity computation circuitry (335).

In some embodiments of the presently disclosed subject matter, permutation unit (350) can be configured to reorder information symbols prior to encoding with the outer code. Permutation unit (350) can be do this for example, by retrieving information symbols received from memory (320), permuting them, and storing the permuted symbols in memory (320) for processing by parity generation unit (330).

Parity generation unit (330) can be configured to, for example, retrieve permuted information symbols from memory (320), activate parity computation circuitry (335) to encode the permuted information symbols according to a linear cyclic code (outer code) in use in the system, and store resulting codewords (for example: including parity symbols) in memory (320) for further processing.

Parity computation circuitry (335) can be operably connected to parity generation unit (330) and memory (320). Parity computation circuitry (335) can be implemented, for example, using methods described hereinbelow with reference to FIGS. 7-10. Inner code encoding unit (340) can be configured to, for example, encode the resulting symbols of the outer code codeword (including parity symbols) according to the system's inner code (for example: a polar code). and controller unit (310) can be configured to subsequently transmit the resulting concatenated code codeword over the communications transceiver (360).

It is noted that the teachings of the presently disclosed subject matter are not bound by the ECC encoder system described with reference to FIG. 3. Equivalent and/or modified functionality can be consolidated or divided in another manner and can be implemented in any appropriate combination of software with firmware and/or hardware and executed on a suitable device.

Figure 4:
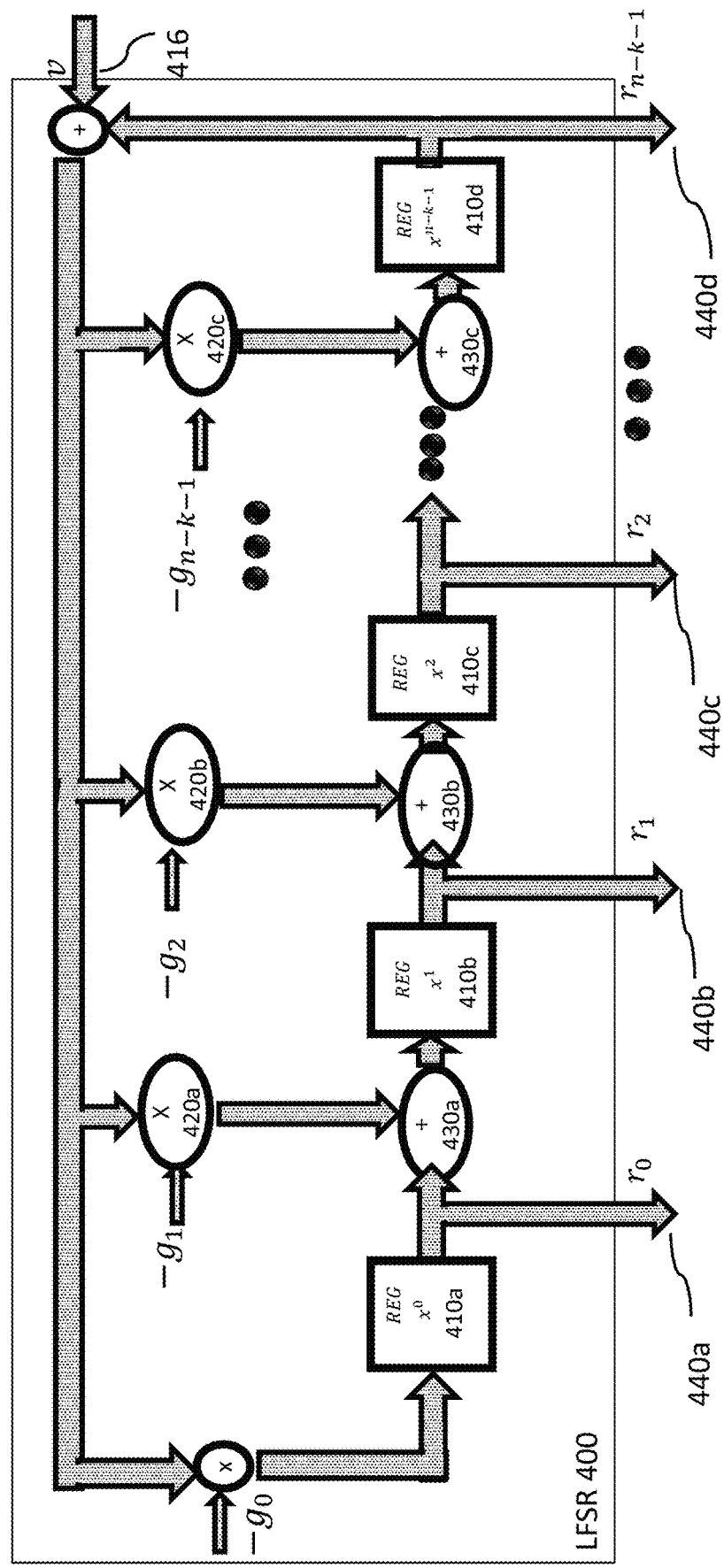
FIG. 4 is a schematic illustration of an exemplary prior-art system for systematic encoding with linear cyclic codes or shortened linear cyclic codes based on a generator polynomial $g(x)=\Sigma_{i=0}^{n-k-1} g_i x^i + x^{n-k}$.

Reference is made to FIG. 4 that provides a schematic illustration of an exemplary prior-art system for systematic encoding with linear cyclic codes or shortened linear cyclic codes based on a generator polynomial $g(x)=\Sigma_{i=0}^{n-k-1} g_i x^i + x^{n-k}$. The system is referred to as Linear Feedback Shift Register (LFSR) (400).

In some embodiments, the LFSR implements encoding of a linear cyclic code C of length n and dimension k over a field F. For each codeword $c \in C$ there is a corresponding polynomial $c(x)=\Sigma_{i=0}^{n-1} c_i \cdot x^i$ (i.e. the coefficient of $x^i$ in $c(x)$ is $c_i \in F$).

It is noted that $c^{(i \rightarrow)}(x)=R_{x^n-1}[x^i \cdot c(x)]$. The generator polynomial $g(x)$ for code C is the monic polynomial $g(x)=\Sigma_{i=0}^{n-k} g_i \cdot x^i$ such that for each codeword $c \in C$ $g(x)|c(x)$ and $g(x)|x^n-1$.

The LFSR (400) can contain an array of n–k register units (410), wherein each register unit can represent a coefficient of the residual polynomial of $R_{g(x)}[x^{n-k}(\Sigma_{i=0}^{l} w_i x^{l-i})]=\Sigma_{i=0}^{k-1} r_i x^i$. REG $x^0$ can contain the coefficient of $x^0$ in this representation, REG $x^1$ can contain the coefficient of $x^1$ etc. The registers (410) can be, for example, initialized to zero before the encoding begins.

On a clock cycle i, an information symbol $v_i$ can be input to, for example, information symbol input signal (416).

In some embodiments, the LFSR operates such that when $R_{g(x)}[x^{n-k}(\Sigma_{i=0}^{l} w_i x^{l-i})]=\Sigma_{i=0}^{n-k-1} r_i x^i$ is represented in the registers (410) at the beginning of a clock cycle, at the end of the clock cycle the registers will contain $R_{g(x)}[x^{n-k}(w_{l+1}+x\Sigma_{i=0}^{l} w_0 x^{l-i})]$.

By assigning $v=w_{l+1}$, we have on the next clock cycle $R_{g(x)}[x^{n-k}(w_{l+1}+x\Sigma_{i=0}^{l} w_0 x^{l-i})]=R_{g(x)}[w_{l+1} x^{n-k}+x \Sigma_{i=0}^{n-k-1} r_i x^i]=\Sigma_{i=0}^{n-k-2} r_i x^{i+1}+(w_{l+1}+r_{n-k-1}) \cdot R_{g(x)}[x^{n-k}]=\Sigma_{i=0}^{n-k-2} r_i x^{i+1}+(w_{l+1}+r_{n-k-1}) \cdot \Sigma_{i=0}^{n-k-1} -g_i x^i = -g_0 \cdot (w_{l+1}+r_{n-k-1})+\Sigma_{i=0}^{n-k-1}(r_{i-1} - g_i \cdot (w_{l+1}+r_{n-k-1}))x^i$.

Thus, in some embodiments, after the symbols of information vector $u_0, u_1 \ldots u_{k-1}$, have been provided sequentially (a new symbol at each clock) to the LFSR, the registers array (416) contains the residue $R_{g(x)}[x^{n-k} \Sigma_{i=0}^{k-1} u_i \cdot x^{k-1-i}]$. and these coefficients can be read from output signals 440.

As a consequence, in some embodiments, the vector $[-r_0, -r_1 \ldots, -r_{n-k-1}, u_{k-1}, u_{k-2}, \ldots, u_0]$ is a systematic cyclic codeword.

It is noted that, in some embodiments, the multiplications (420) are done in the field F.

It is noted that, in some embodiments, if $g_i=0$ then the corresponding feedback line and adder (430) may be omitted. Also, if F is an extension field of characteristic 2 (i.e. isomorphic to $GF(2^i)$) then additions and subtractions are the same operation.

It is noted that in the LFSR described in FIG. 4 the number of clock-cycles required for encoding is generally equal to the dimension of the code C, i.e. k clock-cycles.

Figure 5:
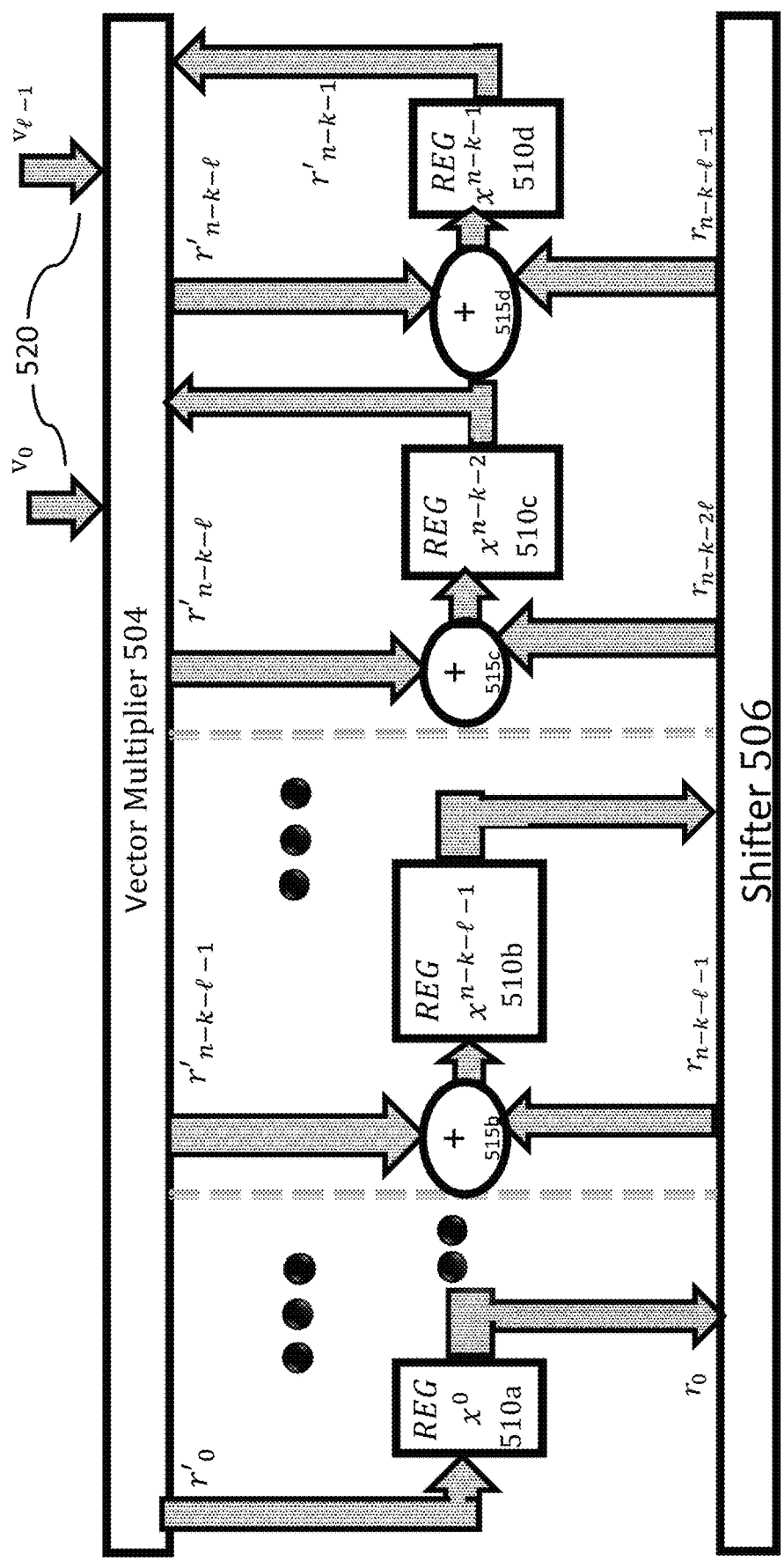
FIG. 5, depicts a prior art system for encoding with linear cyclic codes or shortened linear cyclic codes based on a generator polynomial g(x)

Reference is made to FIG. 5, which depicts a prior art system for encoding with linear cyclic codes or shortened linear cyclic codes based on a generator polynomial g(x). In this system, the information payload may be processed in chunks of length l which can result in k/l clock cycles for encoding a codeword.

Vector $v_0^{l-1}$ denotes the input symbols that will be supplied to the circuit. As in FIG. 4, a registers array (510) maintains the current remainder of dividing the input polynomial by g(x).

The shifter component (506) receives the symbols $r_0^{n-l-1}$ as shifter input (520) and shifts them to the left such that $r_i$ is input to the adder (515) that operably connected to the input of "REG $x^{i+l}$" for each $i \in [n-l]$.

Vector multiplier (504) is a computational circuit that calculates $r'(x) = R_{g(x)}[f(x) \cdot x^{n-k}]$ where f(x) is defined as $\Sigma_{i=0}^{l-1}(r_{n-k-l+i}+v_i) \cdot x^i$. The successive input symbols of vector $v_0^{l-1}$ are input signals (520) to vector multiplier (504). The l rightmost values of the registers array, i.e. $r_{n-k-l}^{n-k-1}$ also input to vector multiplier (504).

After j clock cycles the shift register contains coefficients of $r(x) = R_{g(x)}[x^{n-k} \cdot \Sigma_{i=0}^{jl-1} w_i x^{jl-1-i}]$ where input $v_0^{l-1}$ may be equal to sub-vector $w_{tl}^{(t+1)l-1}$ (in reverse order, i.e. $v_i = w_{(t+1)l-1-i}$) for clock-cycles $t \in [j]_-$. On clock-cycle j it is desired to calculate $r(x) = R_{g(x)}[x^{n-k} \cdot (\Sigma_{i=0}^{l-1} w_{jl+i} x^{l-1-i} + x^l \cdot \Sigma_{i=0}^{jl-1} w_i x^{jl-1-i})]$. This is accomplished by introducing $w_{jl}^{(j+1)l-1}$ on the input signals $v_0^{l-1}$ 4020 in a reversed order (i.e. $v_i = w_{(j+1)l-1-i}$) and operating the circuit.

It is noted that $R_{g(x)}[x^{n-k} \cdot (\Sigma_{i=0}^{l-1} w_{jl+i} x^{l-1-i} + x^l \cdot \Sigma_{i=0}^{jl-1} w_i x^{jl-1-i})] = R_{g(x)}[x^{n-k} \cdot (\Sigma_{i=0}^{l-1} w_{jl+i} x^{l-1-i}) + x^l \cdot \Sigma_{i=0}^{(n-k-1)} r_i x^i] = R_{g(x)}[x^{n-k} \cdot (\Sigma_{i=0}^{(l-1)} v_i x^i) + x^l \cdot \Sigma_{i=0}^{(n-k-1)} r_i x^i] = R_{g(x)}[x^{n-k} \cdot (\Sigma_{i=0}^{(l-1)} (v_i + r_{n-k-l+i}) x^i)] + \Sigma_{i=0}^{(n-k-l-1)} r_i x^{i+l} = R_{g(x)}[x^{n-k} \cdot (\Sigma_{i=0}^{(l-1)} (v_i + r_{n-k-l+i}) x^i)] + \Sigma_{i=0}^{(n-k-l-1)} r_i x^{i+l} = r'(x) + \Sigma_{i=0}^{(n-k-l-1)} r_i x^{i+l}$.

Figure 6:
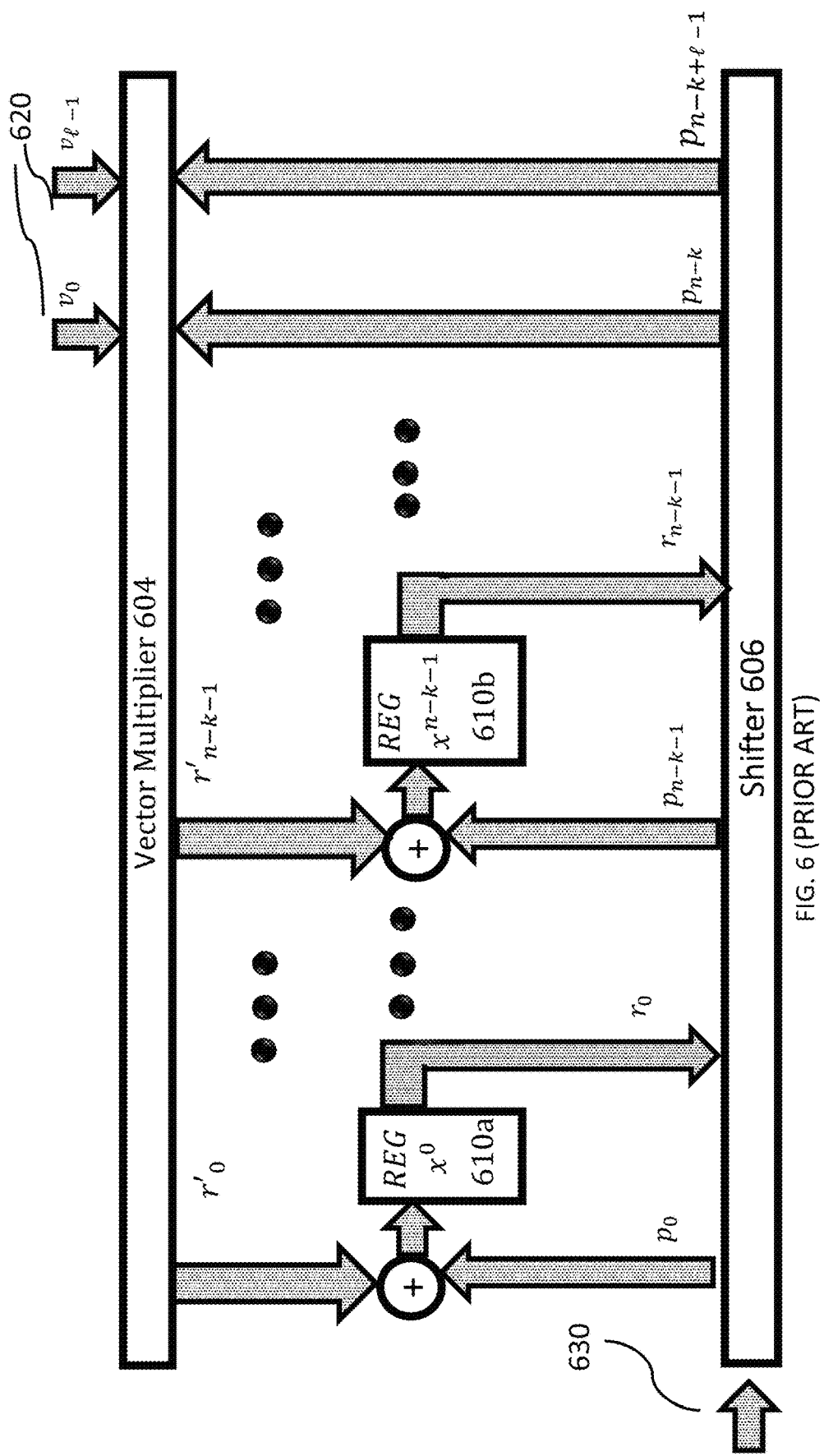
FIG. 6, depicts yet another system for encoding a cyclic linear code with generator polynomial g(x)

Reference is made to FIG. 6, which depicts yet another system for encoding a cyclic linear code with generator polynomial g(x). In this system, the information payload may be processed in chunks of at most $l \leq n-k$ symbols in each clock-cycle.

In contrast to the FIG. 5 system, the blocks processed in one clock-cycle may be of any length in the range of 0 to l symbols. The actual block size is given as input to the circuit on input signal s (630). It is assumed that $v_s^{l-1}=0$, i.e. if the current block size is s then it is assumed that its l-s suffix contains zeros (if s=l then all the vector is occupied). Vector Multiplier 604 has the same specification as 504.

In contrast to the FIG. 5 system, $\rho_{n-k}^{n-k+l-1}$ which is the suffix of the output of Shifter (606) is an input to the vector multiplier 604. Shifter (606) is controlled by the input s (510). The shifter receives the input vector $r_0^{n-k-1}$ and outputs the vector $\rho_0^{n-k+l-1}$ such that, $\rho_0^{n-k+l-1}$ is the vector r shifted by s places, i.e. $\rho_i=0$ for $i \in [s]_-$ and for $i \geq n-k+s$; $\rho_i=r_{i-s}$ for $s \leq i \leq n-k+s-1$.

Exemplary usage of FIG. 6 circuit is as follows. The input vector $u_0^{n-k-1}$ may be partitioned into non-overlapping sub-vectors $u^{(0)}, u^{(1)}, \ldots, u^{(m-1)}$ each one of them of length at most l symbols. $l_i \leq l$ denotes the length of $u_{(i)}$, $L_i$ is defined as $\Sigma_{j=0}^i l_j$ for $i \in [m]_-$ and $L_{-1}=0 \cdot u^{(i)}$ is defined as $u_{L_{i-1}}^{L_i+1-1}$ for $i \in [m]_-$. It is noted that when the circuit is started the "REG $x^i$" registers have been initialized to zero. In each one of the following clock-cycles $i=0, \ldots, m-1$ s is set to $l_i$ and $v_0^{l-1}$ is set to $u^{(i)}$ ($v_j=0$ for $l > j \geq l_i$). As such, in the beginning of clock-cycle+1 $\Sigma_{j=0}^{n-k-1} r_j x^j = R_{g(x)}[x^{n-k} \cdot \Sigma_{j=0}^{L_i-1} u_j x^{L_i-1-j}]$. It is noted that in the beginning of clock-cycle m it is the case that $\Sigma_{j=0}^{n-k-1} r_j x^j = R_{g(x)}[x^{n-k} \cdot \Sigma_{j=0}^{k-1} u_j x^{k-1-j}]$. As such the encoded codeword is $[p_0, p_1, \ldots, p_{n-k-1}, u_{k-1}, u_{k-2}, \ldots u_1, u_0]$, where $p_i=-r_i$ for $i \in [n-k]_-$.

Figure 7:
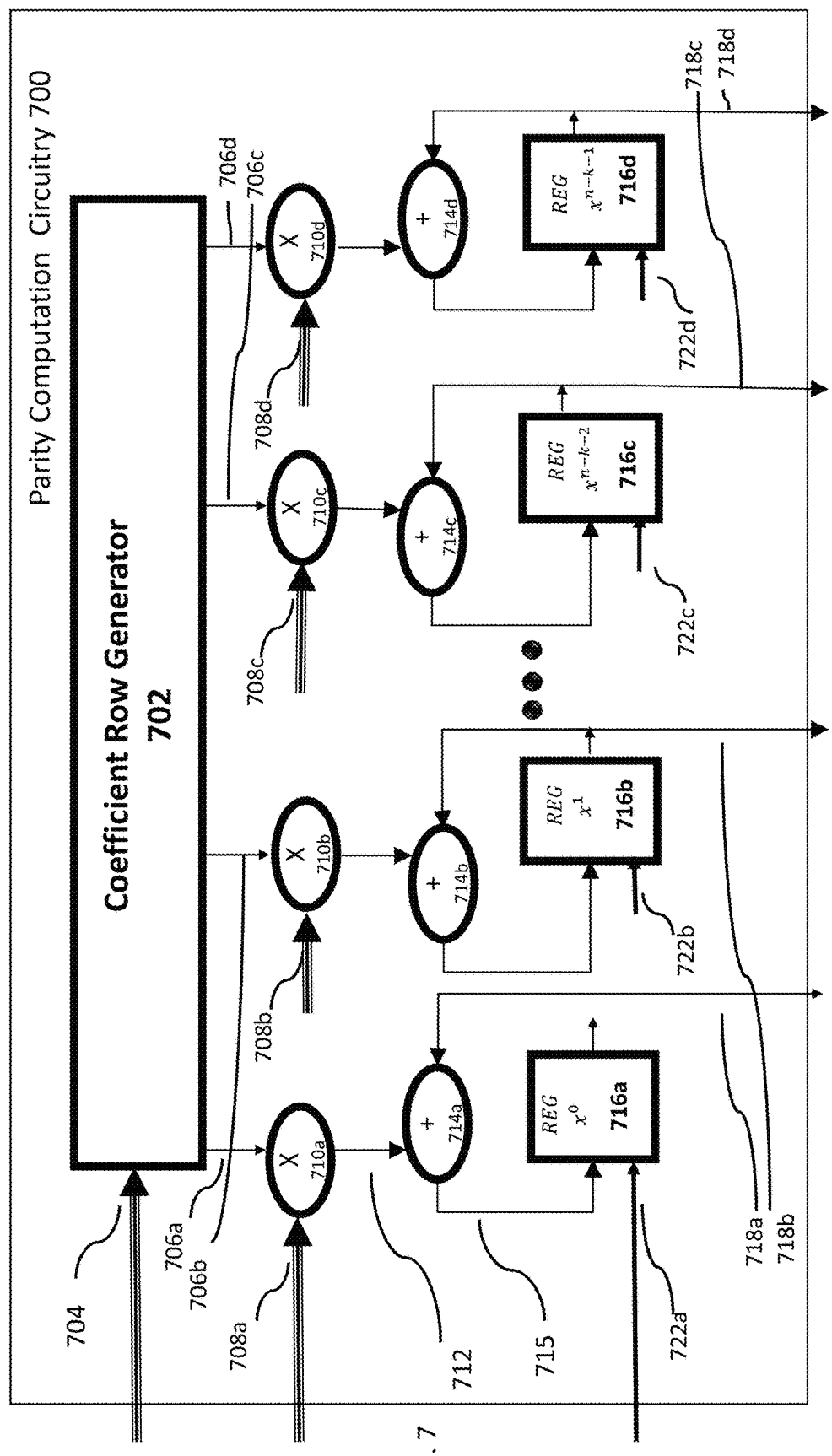
FIG. 7, illustrates an exemplary structure of the parity computation circuitry, in accordance with some embodiments of the presently disclosed subject matter.

Attention is now directed to FIG. 7, which illustrates an exemplary structure of the parity computation circuitry (335), in accordance with some embodiments of the presently disclosed subject matter.

As described above with reference to FIGS. 1-3, some encoder/decoder systems can utilize a concatenated ECC wherein a permutation of the outer-code codeword is encoded with an inner-code. Moreover, some such encoder/decoder systems can utilize a linear cyclic code as the outer code, employ a "distributed parity" permutation (thus reordering the symbols of the outer-code codeword), and utilize a polar code as an inner code.

LFSR-based methods for computing linear codes (such as the methods described above, with reference to FIGS. 4-6) can require that information symbols be provided to the LFSR in their unpermuted order. Thus, to use the prior art methods to encode with distributed parity, it can be necessary to receive all of the information symbols of a full codeword of the linear cyclic code (e.g. from an application, or from a communications medium), compute parity using the LFSR, and only then perform the required permutation of the information and parity symbols, before finally performing inner-code encoding and transmission. Thus, these methods can result in high latency.

Similarly, to use these prior art LFSR-based methods to validate a received codeword with distributed parity (e.g. in ECC decoder (200)), it can be necessary to receive all of the information symbols of a full codeword of the linear cyclic code, and only then perform the required reverse permutation of the symbols as required for decoding and verification. These methods can thus involve high latency, and also might not be readily usable before completion of the full inner-code decoding (so early termination, for example, might not be possible).

In some embodiments of the presently disclosed subject matter, parity computation circuitry (235 or 335) in accordance with FIG. 7 can be used to facilitate low-latency parity calculation wherein some parity symbols of a codeword can be calculated on the basis of a subset of the permuted information symbols. In some embodiments of the presently disclosed subject matter, parity computation circuitry (235 or 335) in accordance with FIG. 7 can provide parity calculation with low complexity similar to simplicity of an LFSR, without requiring accumulation of all information symbols and thus facilitating low latency. Generation of parity symbols on the basis of a subset of information symbols is hereforward referred to as early parity generation.

Parity symbols resulting from early parity generation can, for example, be encoded with the inner code (in the case of parity generation for transmission), or be compared with received parity symbols (in the case of parity generation for validation of received data). This processing of parity symbols resulting from early parity generation can, for example, take place concurrently with the processing of subsequent information symbols (e.g. from a higher-layer in the case of encoding for transmission, or from the communications medium in the case of decoding received data). It is noted that in embodiments of encoders using, for example, a non-concatenated ECC, parity symbols resulting from early parity generation can simply be transmitted.

In some embodiments of the presently disclosed subject matter, parity computation circuitry (235) in accordance with FIG. 7 can be used to facilitate "early termination" of the inner code decoding i.e. discarding a decoding candidate (or even halting the decoding process) when it is detected that a received inner code codeword has been irreparably corrupted. An exemplary method of decoding with early termination is described hereinbelow, with reference to FIG. 9.

The parity generation circuitry (700) can include a series of per-coefficient memory registers (shown in an exemplary manner as 716a, 716b, 716c, 716d). The actual number of per-coefficient memory registers in a given implementation can correspond, for example, to the number of columns in the generating matrix of the linear cyclic code being implemented.

The parity computation circuitry (700) can include a reset input control signal (722), and can, for example, upon receipt of reset control input signal (722) (by, for example, controller unit (210 or 310)) reset the contents of each per-coefficient memory register (716a, 716b, 716c, 716d) to 0.

Parity computation circuitry (700) can include data input signals including, for example, information symbol input signals (shown in an exemplary manner as 708a, 708b, 708c, 708d) and information symbol index input signal (704). In some embodiments of the presently disclosed subject matter, the information symbol input signals (708a, 708b, 708c, 708d) convey the next information symbol, while information symbol index input signal (704) conveys the corresponding information symbol index i.e. the original (i.e. pre-permutation) position of the symbol in the series of information symbols for which parity is to be calculated.

The input signals, as well as output signals and internally generated data (e.g. 706, 712, 718) can be implemented, for example, as signals on a hardware bus. Alternatively, for example, the input signals and internal data can be implemented, for example, as data stored in memory locations, as software signals implemented using a software method, etc. In some embodiments of the presently disclosed subject matter, a distinct information symbol input signal is provided for each per-coefficient memory register, so that the actual number of information symbol input signals is equal to, for example, the number of columns in the generating matrix of the linear cyclic code being implemented. In some embodiments of the presently disclosed subject matter, a single information symbol input signal is provided.

The parity computation circuitry (700) can, for example, receive a series of permuted information symbols—with each information symbol being supplied with an associated information symbol index denoting the symbol's position in the pre-permutation series of information symbols. The symbol and its index can be supplied, for example, via the information symbol input signal (708) and information symbol index input signal (704) respectively. The symbol and its index can be supplied by, for example, controller unit (210) of an encoder or controller unit (310) of a decoder. A new symbol and index can be supplied, for example, each clock cycle.

Parity computation circuitry (700) can include Coefficient Row Generator (702). Coefficient Row Generator (702) can receive, for example, an input consisting of an information symbol index input signal (704), and can, for example, generate—in response—a series of coefficients (exemplarily shown as 706a, 706b, 706c, 706d) which correspond to the parity columns (assuming systematic encoding) of the row of the linear cyclic code's generating matrix that corresponds to the information symbol index that was input. In some embodiments of the presently disclosed subject matter, the actual number of coefficients (708a, 708b etc.) generated by coefficient row generator (702) in a particular implementation is equivalent to the number of columns in the generating matrix of the linear cyclic code being implemented.

By way of non-limiting example: if information symbol index input signal (704) carries the value 4, coefficient row generator (702) can generate the coefficients of the fourth row of the generating matrix of the linear cyclic code being implemented.

Exemplary implementations of coefficient row generator (702) are described hereinbelow, with reference to FIGS. 10-12.

Parity calculation circuitry (700) can include per-coefficient multiplier components (exemplarily shown as 710a, 710b, 710c, 710d). In some embodiments of the presently disclosed subject matter, the actual number of per-coefficient multiplier components in a particular implementation is equivalent to the number of columns in the generating matrix of the linear cyclic code being implemented. Each per-coefficient multiplier component (710) can multiply the corresponding parity coefficient (706a, 706b, 706c, 706d) generated by the Coefficient Row Generator (702) with the current input information symbol (708a, 708b, 708c, 708d).

The multipliers (710a, 710b, 710c, 710d) can be implemented using any suitable method e.g. logical gates, Field Programmable Gate Array (FPGA), microcontroller with software etc. It is noted that when symbols are binary (i.e. the symbols are bits), field multiplication is equivalent to logical "and".

Parity calculation circuitry (700) can include per-coefficient adder components (exemplarily shown as 714a, 714b, 714c, 714d). In some embodiments of the presently disclosed subject matter, the actual number of per-coefficient adder components in a particular implementation is equivalent to the number of columns in the generating matrix of the linear cyclic code being implemented). Each per-coefficient adder component (714a, 714b, 714c, 714d) can add the output of the corresponding multiplier (710a, 710b, 710c, 710d) to the current value of the per-coefficient memory register (716a, 716b, 716c, 716d) (the current value of the per-coefficient memory register being received, for example, via a feedback signal), and then write the result into the per-coefficient memory register (716a, 716b, 716c, 716d).

The adders (714a, 714b, 714c, 714d) can be implemented using any suitable method e.g. logical gates, Field Programmable Gate Array (FPGA), microcontroller with software etc. It is noted that when symbols are binary (i.e. the symbols are bits), field addition is equivalent to logical "or".

The content of each per-coefficient memory register (716a, 716b, 716c, 716d) can, for example, be read from parity output signals (716a, 716b, 716c, 716d) of parity computation circuitry (700).

As described hereinabove, particular parity symbols generated by a linear cyclic code are in some cases dependent on a subset of the information symbols, whereas other parity symbols are in some cases dependent on all of the information symbols.

More formally:
the original sequence of information symbols is represented as $u_0, u_1, \ldots u_k$
the sequence of parity symbols to be generated by the linear cyclic encoding is represented as $p_0, p_1, \ldots p_{n-k}$
the permuted sequence of information symbols is represented as $\hat{u}_0, \hat{u}_1, \ldots \hat{u}_k$ Each of the parity symbols ($p_0, p_1, \ldots p_{n-k}$) is dependent on specific information symbols of the permuted sequence ($\hat{u}_0, \hat{u}_1, \ldots \hat{u}_k$). The linear cyclic code itself determines which particular information symbols affect which particular parity symbols.

The term "parity completion criterion" for a particular parity symbol p refers to a condition wherein all input information symbols û which affect parity symbol p have been processed by the parity computation circuitry (235 or 335).

By way of non-limiting example, in some embodiments of the parity computation circuitry (700) depicted in FIG. 7: when the input information symbols û which affect parity symbol p have been received by coefficient row generator (702) with the resulting coefficients being multiplied (710*a*, 710*b*, 710*c*, 710*d*) with the information symbol index, and added (714*a*, 714*b*, 714*c*, 714*d*) to the per-coefficient memory registers (716*a*, 716*b*, 716*c*, 716*d*), the parity completion criterion is satisfied. Thus when the parity completion criterion for a particular parity symbol p has been satisfied, the corresponding parity output signal (e.g. 718*a*, 718*b*, 718*c*, 718*d*) carries the completely calculated parity symbol, and the parity symbol may be utilized.

Exemplary methods for utilizing the exemplary parity computation circuitry (700) are described hereinbelow, with reference to FIG. 9.

It is noted that the teachings of the presently disclosed subject matter are not bound by the parity calculation circuitry described with reference to FIG. 7. Equivalent and/or modified functionality can be consolidated or divided in another manner and can be implemented in any appropriate combination of software with firmware and/or hardware and executed on a suitable device.

Attention is now directed to FIGS. 7*a*-8*b* which illustrates an implementation of a cyclic code encoder for permuted input according to some embodiments of the presently disclosed subject matter.

Figure 7A:
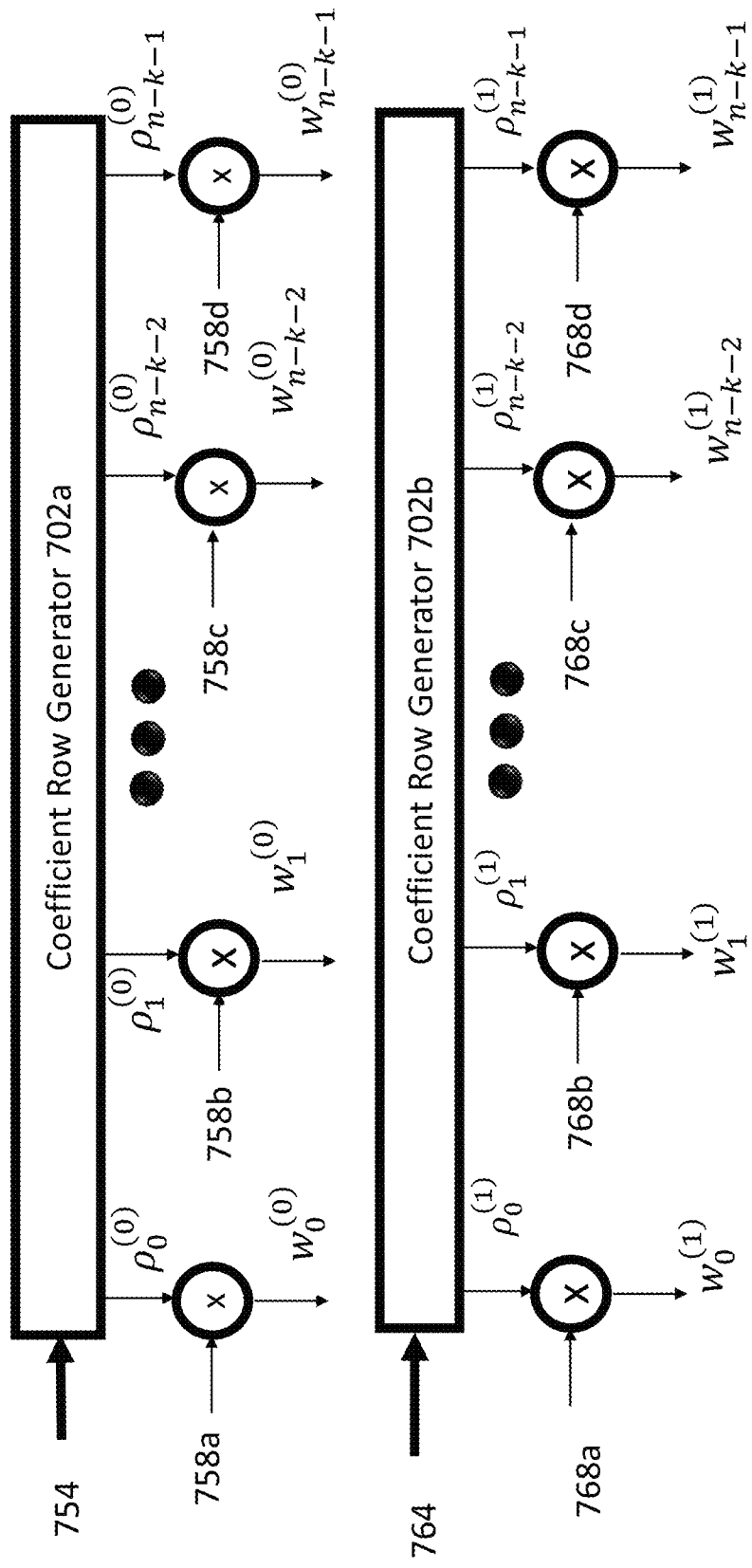
FIGS. 7a-7b illustrates an implementation of a cyclic code encoder for permuted input according to some embodiments of the presently disclosed subject matter.
Figure 7B:
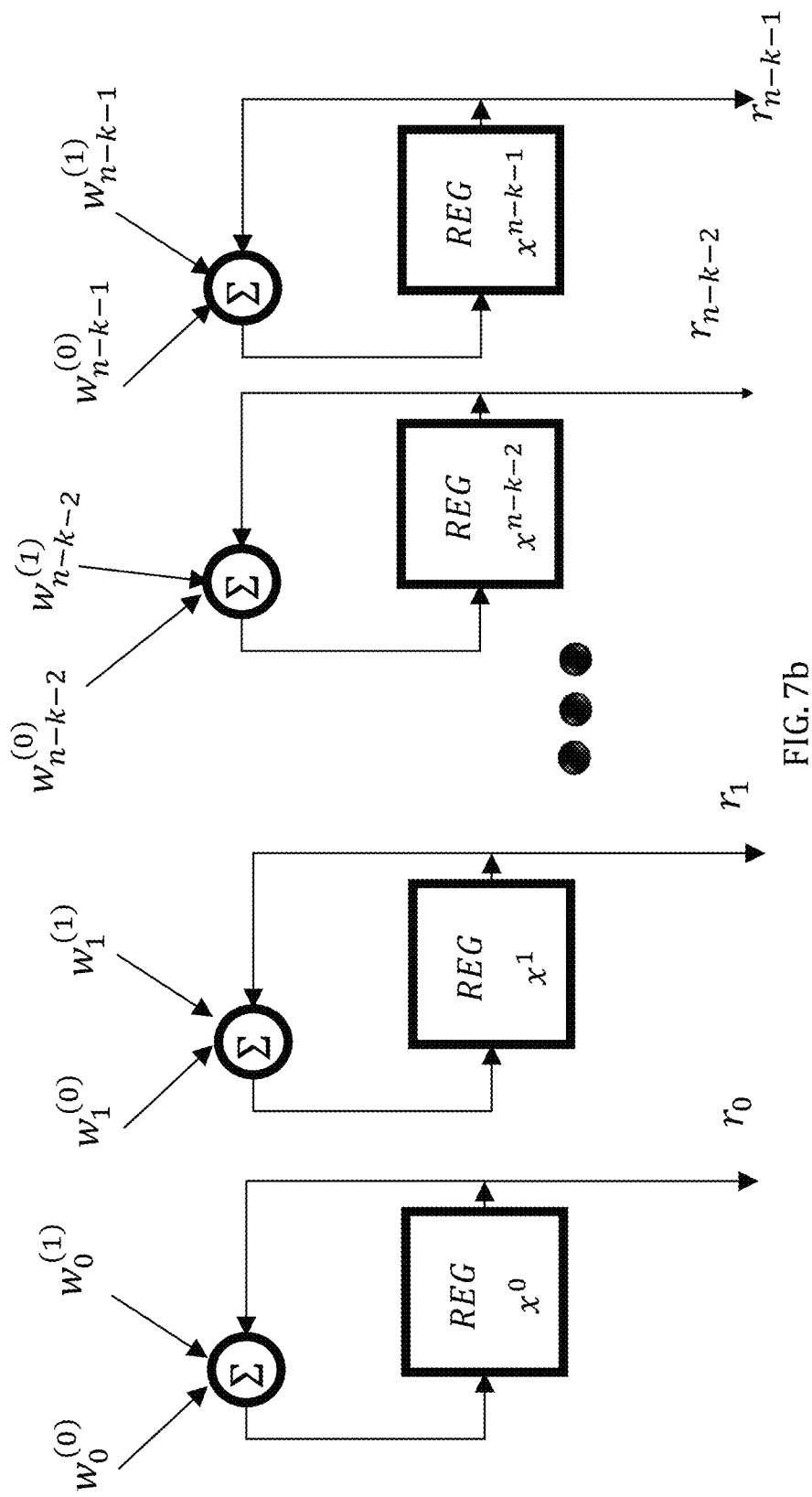

The system of FIGS. 7*a*-7*b* represents a generalization of FIG. 7, and facilitates insertion of two input information symbols simultaneously to the circuit. The two symbol inputs are input to the system on two input signals (758 and 768). Each input signal can be multiplied by a coefficient output of a distinct coefficient row generator (702*a*, 702*b*) at a multiplication element. There can be corresponding row index input signals (754 and 764), which are assumed here to represent decimal values $i_0$ and $i_1$, respectively.

When introduced with two input information symbols $u_{i_0'}$ and $u_{i_1'}$ assigned to input signals 758 and 768 respectively, binary representations of $i_0 = k-1-i_0'$ and $i_1 = k-1-i_1'$ can be assigned to idx0 and idx1, respectively. The resultant outputs of the coefficient row generators (702*a*, 702*b*) the two symbol inputs, respectively, generating vectors $w^{(0)}$ and $w^{(1)}$, respectively.

In FIG. 7*b*, vectors $w^{(0)}$ and $w^{(1)}$ are, in turn, added to the current value of the registers array.

The number of supported input symbols may be increased by introducing to FIG. 7 additional copies of coefficient row generator (each one being utilized for a different input symbol), and adding their values (multiplied by their corresponding input) to the registers array.

In some embodiments of the presently disclosed subject matter, a coefficient row generator can utilize a look-up-table (LUT) implemented by a memory unit (e.g. RAM, ROM, registers array, etc.) indexed by the idx input. In such a case when an idx is introduced, the look-up table can output the entry corresponding to this index. Such an implementation may require memory of k rows and (n–k) columns, with total size of $k \cdot (n-k) \cdot \lceil \log_2 |F| \rceil$ bits.

Figure 8:
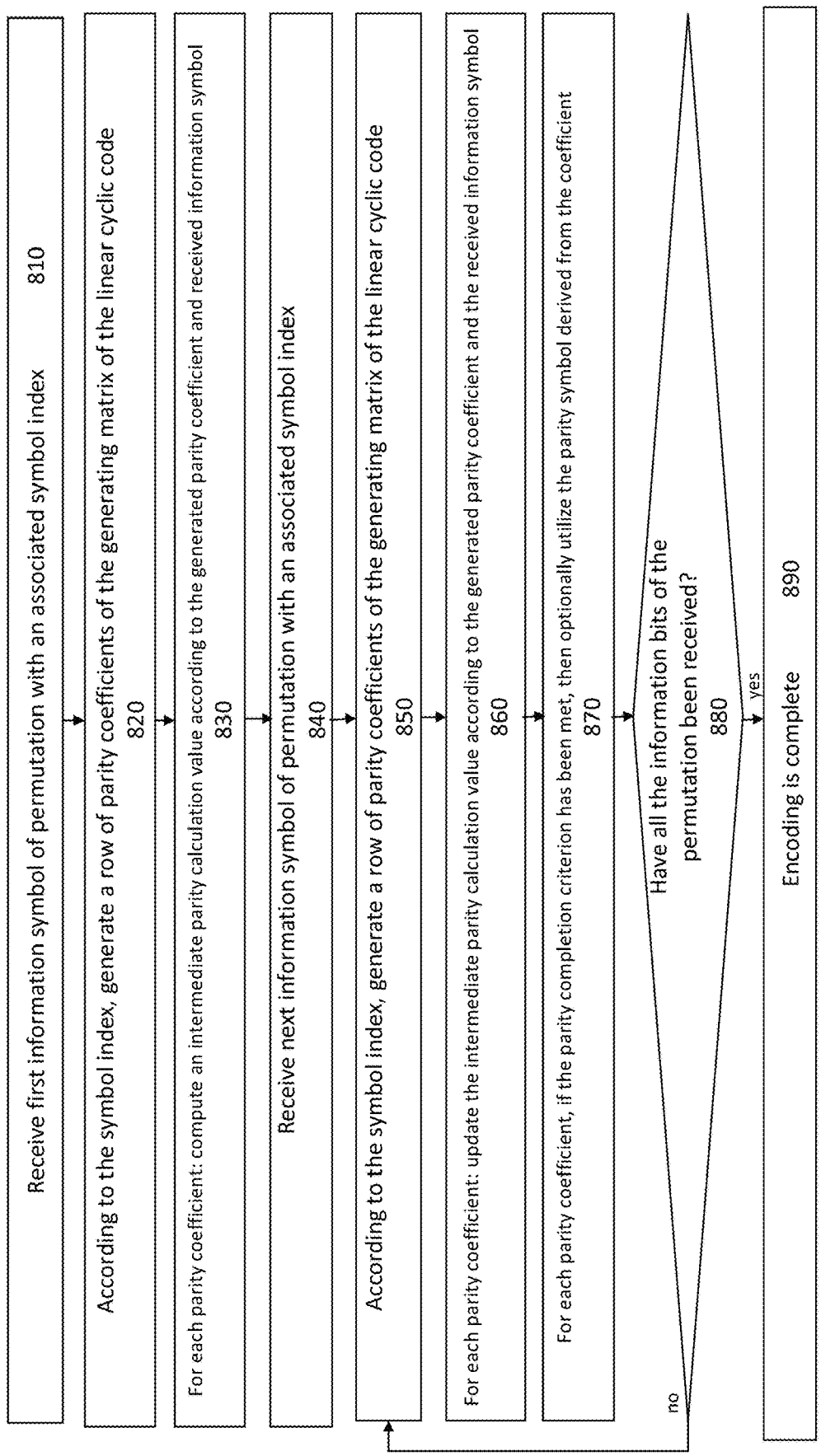
FIG. 8, illustrates a generalized flow diagram of an exemplary method for early calculation of parity symbols of a linear cyclic or shortened linear cyclic code, from a permutation of information symbols, according to some embodiments of the presently disclosed subject matter.

Attention is now drawn to FIG. 8, which illustrates a generalized flow diagram of an exemplary method for early calculation of parity symbols of a linear cyclic or shortened linear cyclic code, from a permutation of information symbols, according to some embodiments of the presently disclosed subject matter. The method illustrated in FIG. 8 can be implemented, for example, in a system such as the one illustrated in FIG. 7, or in another suitable system.

The method can be used, for example, as part of a system of encoding data for transmission, or, for example, as part of a system for verifying and/or correcting received data. The method can be executed, by way of non-limiting example, by processing circuitry (for example: controller unit (210) or controller unit (310), in conjunction with, for example, parity generation circuitry (700)).

The method can utilize, for example, parity symbol memory. Parity symbol memory can be, for example, a memory such as a hardware-based memory which can store values usable for computing parity symbols and can maintain the stored values between processing circuitry clock cycles. By way of non-limiting example, parity symbol memory can be a group of memory registers such as the per-parity symbol memory registers (716) in exemplary parity generation circuitry (700). Alternatively, parity symbol memory can be, for example, an embedded software system using a range of memory locations in some type of non-volatile storage (for example: flash memory)—in this case written or retrieved parity symbol values might not be identical to the contents of the physical memory, as the memory is being managed by the software.

By way of non-limiting example, controller unit (210 or 310) can initialize parity symbol memory by setting reset input signal (722)—causing parity generation circuitry (700) to set the contents of each per-parity symbol memory register (716) to zero. Alternatively, the processing circuitry can use some other method suitable to the parity symbol memory being utilized.

The present method can operate, for example, sequentially (for example: processing one information symbol per clock cycle of the processing circuitry) on a series of information symbols with associated information symbol indexes—the series of information symbols being a permutation of the original series of information symbol, and the information symbol index denoting the position of the information symbol in the original series.

The processing circuitry (205 or 305) (for example: parity computation unit (700)) can begin the process by receiving (810) the first information symbol of the series of permuted information symbols, together with an associated symbol index indicating the position of the symbol in the pre-permutation series. More specifically, by way of non-limiting example, the information symbol and information symbol index can be carried in information symbol input signal (708) and information symbol index input signal (704) respectively.

In, for example, a decoder (200), the information symbols and its associated information symbol indices, can, in some embodiments of the presently disclosed subject matter, be received from, for example, communications transceiver (260). Alternatively, in some embodiments of the presently disclosed subject matter, the information symbols and its associated information symbol indices, can be received from, for example, inner code decoding unit (240) which provides symbols decoded according to an inner code. In, for example, an encoder (300), the series of information symbols and associated information symbol indices, can be received from, for example, permutation unit (350).

Having received the symbol and symbol index, the processing circuitry (205 or 305) (for example: coefficient row generator (702)) can identify, for example, the row of the linear cyclic code's or shortened linear cyclic code's generating matrix that corresponds to the received information symbol index (for example: as indicated by the information symbol index input signal (704)), and then generate (820), for example, the coefficients which correspond to the parity columns (assuming systematic encoding) of the row.

In some embodiments of the presently described subject matter, the generated row of parity coefficients can be implemented in the parity computation unit (700) as internally generated data signals (706)). By generating these coefficients as they are needed, the memory requirements of the system can be, for example, reduced as compared to an implementation that maintains a full matrix.

It is noted that in some embodiments of the presently disclosed subject matter, data other than the parity coefficients themselves can be generated and utilized to compute parity. For example, data derived from the coefficients or otherwise indicative of the coefficients can be generated and subsequently utilized to compute the parity.

It is noted that in some embodiments of the presently disclosed subject matter, a subset of the parity coefficients can be, for example, generated rather than all the parity coefficients.

The processing circuitry (205 or 305) can compute (830), for each of the generated parity coefficients, an intermediate parity calculation value. For the first received symbol, the intermediate parity calculation value can be computed, for example, by performing field multiplication of the information symbol and the generated parity coefficient.

More specifically, by way of non-limiting example, in parity computation unit (700) multiplier components (710) can multiply internally generated data signals (706) for each parity coefficient with information symbol input signal (708)—resulting in internally generated data signals (712). Adder components (714) can then add the multiplication results from internally generated data signals (712) to the values (718) contained in corresponding parity registers (716) (which have been initialized to 0) resulting in internally generated data signals (715). The internally generated data signals (715) can implement the intermediate parity calculation values, and can be stored to the per-parity symbol memory registers (716).

It is noted that the intermediate parity calculation value can be a value from which a particular parity coefficient can be calculated (after subsequent steps) by utilizing, at least, the information symbol and the generated parity coefficient (or data indicative of them).

It is noted that the intermediate parity calculation values can be calculated in various ways and that the examples above are non-limiting. For example, the calculation can be based on the information symbol and the generated parity coefficient (or data derived from them or otherwise indicative of them) and utilize additional constants, or combine non-essential values into the computation etc.

The processing circuitry (205 or 305) can next receive (840) the next information symbol and associated index, and generate (850) parity coefficients accordingly. These steps are the same as 810, 820 described above. The processing circuitry (205 or 305) can update (860) the intermediate parity calculation values—for example by performing field multiplication of the information symbol and the generated parity coefficient and adding the result to the current intermediate parity calculation value (for example: as maintained in per-parity symbol memory registers (716)).

After the intermediate parity calculation values have been updated, there can be some parity coefficients for which a parity completion criterion has been fulfilled. For such coefficients, the parity calculation is now complete—so that the current intermediate parity calculation value (for example: as maintained in per-parity symbol memory registers (716)) contains the actual parity symbol value.

If a parity coefficient has had the parity completion criterion fulfilled, the processing circuitry (205 or 305) can now optionally utilize (880) the parity symbol associated with the coefficient (even though other encoding processing is, for example, continuing).

By way of non-limiting example, the parity symbol can be utilized in an encoder by transmitting it, or by encoding it in a concatenated code.

By way of non-limiting example, the parity symbol can be utilized in a decoder by comparing it to an expected value (such as a received parity symbol) for error-detection or error-correction purposes. By way of non-limiting example, in the case of a linear cyclic code that is an outer code in use with an inner code that is decoded with sequential list decoding, the detected error can be used to remove candidates from the candidate list, or to terminate decoding when there are no candidates with matching parity.

If there are more information bits to be received (880) and encoded, the process can return to receive (840) the next symbol. Otherwise the encoding is complete (890).

It is noted that the teachings of the presently disclosed subject matter are not bound by the flow chart illustrated in FIG. 8, the illustrated operations can occur out of the illustrated order. For example, operations 830 and 840 shown in succession can be executed substantially concurrently or in the reverse order. It is also noted that whilst the flow chart is described with reference to elements of ECC decoder (200), this is by no means binding, and the operations can be performed by elements other than those described herein.

Figure 9:
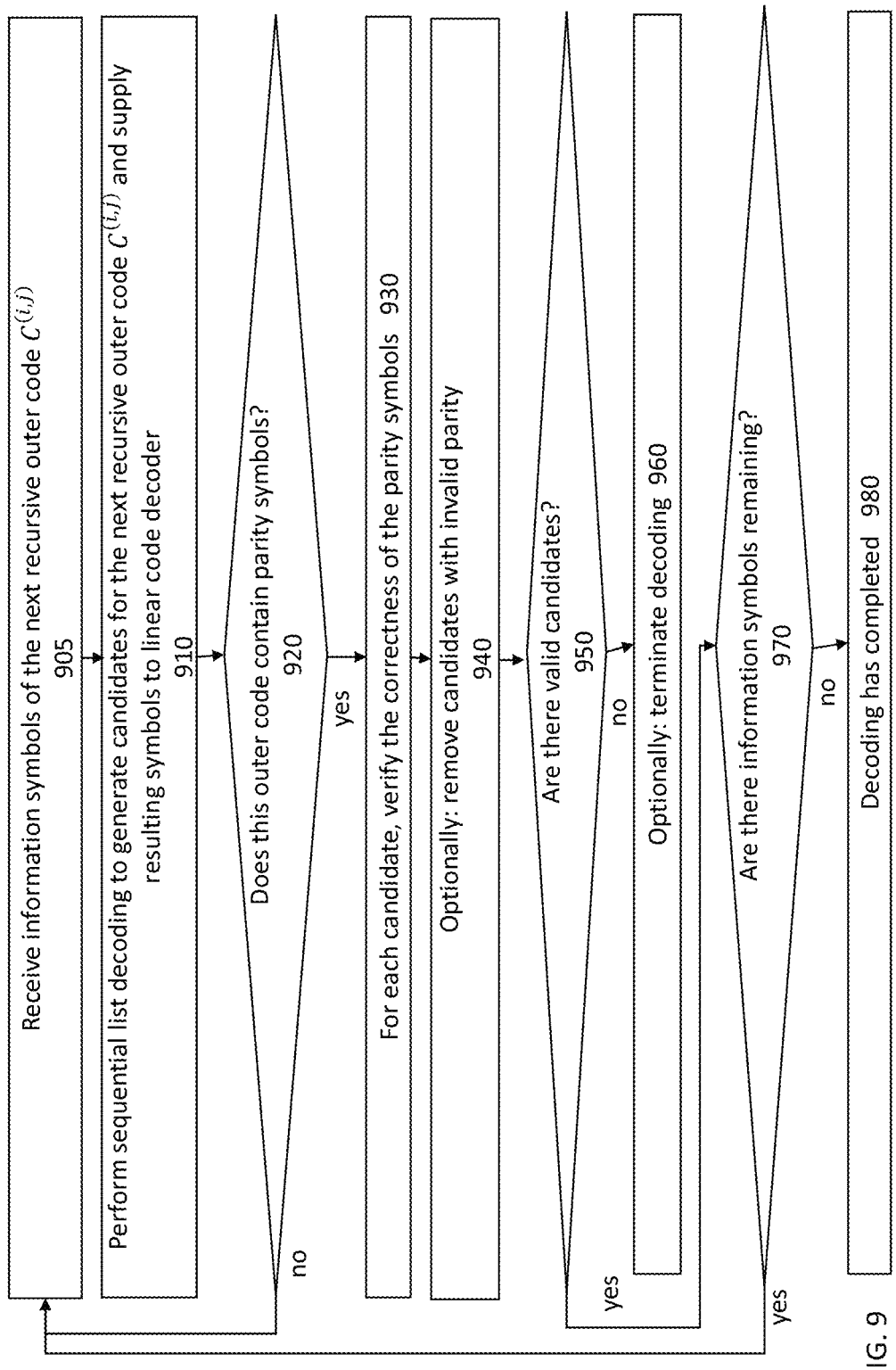
FIG. 9, illustrates an exemplary method for improved sequential decoding of the inner code by utilizing the early parity calculation of a linear cyclic or shortened linear cyclic outer code, according to some embodiments of the presently disclosed subject matter.

Attention is now drawn to FIG. 9, which illustrates an exemplary method for improved sequential decoding of the inner code by utilizing the early parity calculation of a linear cyclic or shortened linear cyclic outer code, according to some embodiments of the presently disclosed subject matter.

By utilizing the early parity calculation, a system embodying the method of FIG. 9 is, for example, able to rule out incorrect list alternatives earlier than might otherwise be possible, thus, for example, reducing latency and power consumption. Furthermore, a system embodying the method of FIG. 9 is, for example, able to detect an irreparably correct codeword earlier than might otherwise be possible, thus, for example, reducing latency and power consumption.

The method of FIG. 9 is herein described with reference to a sequential list decoding method for polar codes as described in Presman op. cit. This method is a recursive method, which decodes the polar code as a recursive sequence of concatenated codes. Accordingly, the sequential list decoding sequence is described as decoding a series of "outer codes" or "recursive outer codes", though in the context of the presently disclosed subject matter, the polar code itself is, for example, referred to as the "inner code".

It will be clear to one skilled in the art how to employ the method of FIG. 9 with other sequential list decode methods, such as sequential list decoding for polar codes as described in Tal and Vardy op. cit. etc.

The processing circuitry (205) can receive (905) information symbols of the next recursive outer code (denoted hereinbelow as $C^{(i,j)}$) and perform (910) sequential list decoding to generate a list of candidate systematic codewords or candidate information words of recursive outer code $C^{(i,j)}$ and supply resulting symbols to the linear code decoder.

The processing circuitry (205) (for example: inner code decoding unit 240) can next check (920) whether recursive outer code $C^{(i,j)}$ includes one or more parity symbols of the outer code (i.e. the linear cyclic code as described above). If there is no parity symbol present in the current recursive outer code, then the processing circuitry (205) (for example: inner code decoding unit 240) can proceed to receive (905) symbols for the next recursive outer code.

In cases where the current recursive outer code does contain parity symbols of the linear cyclic code, the processing circuitry (205) (for example: inner code decoding unit 240) can, for each candidate codeword, evaluate the correctness of the candidate codeword data by comparing the value(s) of the received parity symbol(s) with the computed parity (as represented, for example, by the outputs of parity output signals (718) of parity generation circuitry (700)).

Optionally, the processing circuitry (205) (for example: inner code decoding unit 240) can remove (invalidate) (940) candidate codewords with invalid parity from its list of potential candidates for further processing—which can, for example, result in reduced latency and reduced power consumption. Optionally, the processing circuitry (205) (for example: inner code decoding unit 240) can accept candidate codewords with valid parity for further processing.

If there are no valid candidates (950) (i.e. all candidate codewords contained parity errors), then the processing circuitry (205) (for example: inner code decoding unit 240) can optionally terminate (960) the decoding sequence—which can, for example, result in reduced latency and reduced power consumption.

If there are symbols (970) of the inner code codeword than have not been processed, then processor (205) (for example: inner code decoding unit 240) can return to receive (905) information symbols of the next recursive outer code. Otherwise decoding of the inner code codeword has completed (980).

It is noted that the teachings of the presently disclosed subject matter are not bound by the flow chart illustrated in FIG. 9, and the illustrated operations can occur out of the illustrated order. For example, operations 905 and 910 shown in succession can be executed substantially concurrently. It is also noted that whilst the flow chart is described with reference to elements of ECC decoder (200), this is by no means binding, and the operations can be performed by elements other than those described herein.

Figure 10:
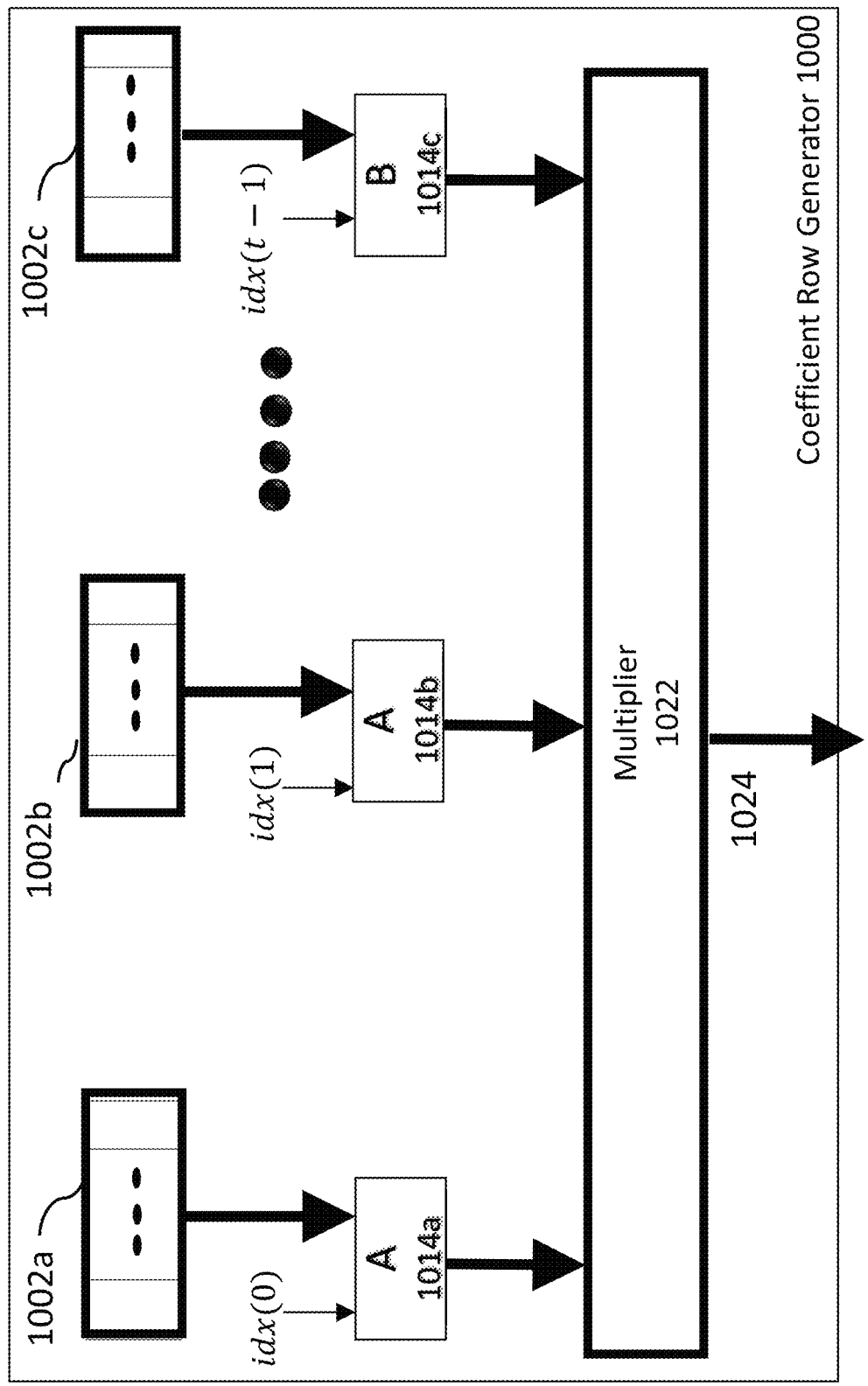
FIG. 10, illustrates an exemplary structure implementing a coefficient row generator according to some embodiments of the presently disclosed subject matter.

Attention is now drawn to FIG. 10, which illustrates an exemplary structure implementing coefficient row generator (702) according to some embodiments of the presently disclosed subject matter.

Coefficient row generator (1000) can include a series of memory units (for example 1002a, 1002b, 1002c). Each memory unit contains a series of memory locations, and can be implemented by, for example, fixed combinational circuits, RAM, ROM, registers etc.

Each memory unit can contain a series of symbols in its memory locations, and the series of symbols can constitute a representation of a polynomial. For example, a memory unit can contain (n–k) symbols representing $R_{g(x)}[x^{2^i}]$ for $i \in [t-1]_-$ and $\pi^{(t-1)}(0:(n-k-1))$ represents $R_{g(x)}[x^{n-k+2^{t-1}}]$.

Element j of register $\pi^{(i)}$, i.e. $\pi^{(i)}(j)$ contains a symbol from the F alphabet, and thereby may be represented by $\lceil \log_2|F| \rceil$ bits.

The output data of each register can be connected to, for example, a circuit controlled by the symbol index with a different vector of n–k coefficients. There can be, for example, two types of circuits receiving the register data: circuit A and circuit B as described hereinbelow.

Circuit A (1014a, 1014b) can, for example, be applied when symbol index "i" is less than "t–1". Circuit A can implement the following formula:

$$\sum_{j=0}^{n-k-1} \tilde{\pi}^{(i)}(j) \cdot x^j = \begin{cases} \sum_{j=0}^{n-k-1} \pi^{(i)}(j) \cdot x^j & idx(i) == 1 \\ 1 & idx(i) == 0 \end{cases}$$

Circuit B (1014c) can, for example, be applied when symbol index i=t–1. Circuit B can implement the following formula:

$$\sum_{j=0}^{n-k-1} \tilde{\pi}^{(t-1)}(j) \cdot x^j = \begin{cases} \sum_{j=0}^{n-k-1} \pi^{(t-1)}(j) \cdot x^j & idx(t-1) == 1 \\ R_{g(x)}[x^{(n-k)}] & idx(t-1) == 0 \end{cases}$$

Multiplier (1022) can, for example, multiply the polynomial representations of $\tilde{\pi}^{(i)}(0:(n-k-1))$ $i \in [t]_-$ Multiplier (1022) can output (n–k bits) to output signal (1024).

The principle according to which the circuit operates is as follows:

if the decimal value corresponding to idx(0:t–1) is l, then the circuit (1014a, 1014b, 1014c) should output $R_{g(x)}[x^{(n-k)+l}]$.

$$\text{Here } \ell = \sum_{\tau=0}^{t-1} idx(\tau) \cdot 2^\tau, \text{ so}$$

$$R_{g(x)}[x^{(n-k)+\ell}] =$$

$$R_{g(x)}\left[x^{(n-k)+\sum_{\tau=0}^{t-1} idx(\tau) \cdot 2^\tau}\right] = R_{g(x)}\left[\prod_{\tau=0}^{t-2} x^{idx(\tau) \cdot 2^\tau} \cdot \left(x^{(n-k)+idx(t-1)2^{t-1}}\right)\right] =$$

$$R_{g(x)}\left[\prod_{\tau=0}^{t-2} R_{g(x)}\left[x^{idx(\tau) \cdot 2^\tau}\right] \cdot R_{g(x)}\left[x^{(n-k)+idx(t-1)2^{t-1}}\right]\right] =$$

$$R_{g(x)}\left[\prod_{\tau=0}^{t-2} \tilde{\pi}^{(\tau)}(x) \cdot \tilde{\pi}^{(t-1)}(x)\right]$$

which results in the output (1024).

That is to say that the circuit uses the binary representation of the l in order to efficiently compute $R_{g(x)}[x^{(n-k)+l}]$. The circuit stores t+2 pre-computed values:

$$R_{g(x)}[x^{n-k}], R_{g(x)}[1], R_{g(x)}[x^{2^{t-1}+(n-k)}], R_{g(x)}[x^{2^i}]$$

for all $i \in [t-1]_-$. The precomputed values can be referred to as "hints" or "hooks" for the computation. These hooks can be used to appropriately generate any requested output.

Other embodiments of the invention can use a different base representation for the hooks. For example, we may use 'base-q' (where $q=2^m$) representation and store hooks $$R_{g(x)}[x^{n-k}], R_{g(x)}\left[x^{(n-k)+q^{\tilde{i}-1}\cdot j}\right], R_{g(x)}[1], R_{g(x)}[x^{q^i\cdot j}]$$

where $$\tilde{t} = \left\lceil \frac{t}{m} \right\rceil,$$

for all j∈[q−1], for all i∈[$\tilde{t}$−1]_. By this we should have $\tilde{t}$−1 instances of circuits A and a single instance circuit B. Circuit A #i, is controlled by idx((i·m): ((i+1)·m−1)) such that its output would be $$\sum_{j=0}^{n-k-1} \tilde{\pi}^{(i)}(j) \cdot x^j = R_{g(x)}\left[x^{\left(\sum_{\tau=0}^{m-1} idx(im+\tau)2^\tau\right)\cdot q^i}\right]$$

and circuit B is controlled by idx((($\tilde{t}$−1)·m): ($\tilde{t}$·m−1)) and its output is $$\sum_{j=0}^{n-k-1} \tilde{\pi}^{(\tilde{t}-1)}(j) \cdot x^j = R_{g(x)}\left[x^{(n-k)+\left(\sum_{\tau=0}^{m-1} idx((\tilde{t}-1)m+\tau)2^\tau\right)\cdot q^{\tilde{t}-1}}\right].$$

Those polynomials may now be multiplied by 922 circuit. Number of polynomial multiplications (modulo g(x)) is $\tilde{t}$−1 while number of hints is $\tilde{t}\cdot(2^m-1)+2$.

Figure 11:
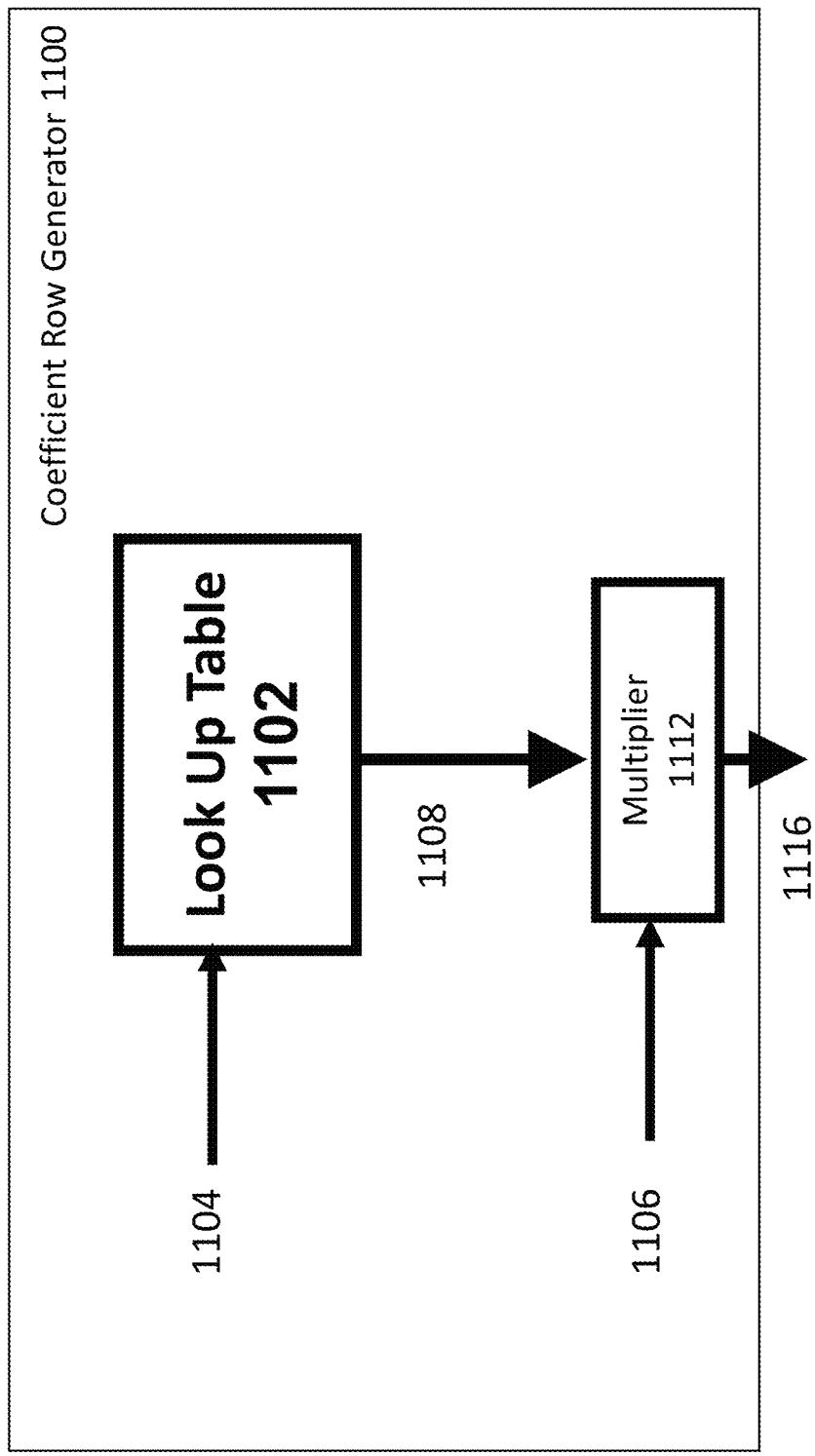
FIG. 11 illustrates an exemplary structure implementing coefficient row generator according to some embodiments of the presently disclosed subject matter.

Attention is now drawn to FIG. 11 which illustrates an exemplary structure implementing coefficient row generator (702) according to some embodiments of the presently disclosed subject matter.

In coefficient row generator (1100), the binary representation of the row index input signal (1104) can be partitioned into two sub-vectors: the r least significant bits (idx(0: τ−1)) (for some τ) can, for example, be input to multiplier (1112), while the t−τ most significant bits (idx(τ: t−1)) can, for example, be utilized as input to the look-up-table (1102).

Look-up-table (1102) can contains a range of P rows that should be generated, sampled uniformly in jumps of $2^\tau$.

In other words, row j in look-up-table (1102) is mapped to $R_{g(x)}[x^{(n-k)+j\cdot 2^\tau}]$ for $$j \in \left[\left\lfloor \frac{k-1}{2^\tau} \right\rfloor + 1\right]_-.$$

Assume that ι is the numerical value of row index input signal (1104). Look-up-table output (1108) is thus $$R_{g(x)}\left[x^{(n-k)+\lfloor \frac{\iota}{2^\tau} \rfloor \cdot 2^\tau}\right].$$

The multiplier circuit (1112) can, for example, multiply Look-up-table output (1108) by $x^T$ (modulo g(x)), where $$T = \iota - \left\lfloor \frac{\iota}{2^\tau} \right\rfloor \cdot 2^\tau$$

(i.e. it is the remainder of ι in division by $2^\tau$, or alternatively $T=\sum_{j=0}^{\tau-1} idx(i)\cdot 2^i$).

As a consequence, multiplier output (1116) corresponds to $R_{g(x)}[x^{n-k+\iota}]$. It is noted that—for a given value of τ—look-up-table (1102) can contain $$\left\lfloor \frac{k-1}{2^\tau} \right\rfloor + 1$$

entries (each entry is a "hint" or a "hook").

Multiplier (1112) can, for example, perform a single multiplication by $x^T$ (modulo g(x)).

In some embodiments of the presently disclosed subject matter, multiplier (1112) can be implemented in a manner which includes $2^\tau$ circuits, such that each circuit computes a multiplication of look-up-table output (1108) by constant polynomial $x^{\tilde{t}}$ (modulo g(x)). The output is selected by employing multiplexers (controlled by 1106) that select the appropriate circuit output.

Some embodiments of the presently disclosed subject matter can utilize "sampling jumps" which are not power of 2. For example, assume that the sampling jump is Δ. In this case, look-up-table (1102) can contain $$\left\lfloor \frac{k+1}{\Delta} \right\rfloor + 1$$

entries, such that entry j can be mapped to $R_{g(x)}[x^{(n-k)+j\cdot \Delta}]$. The input to look-up-table (1102) should be the binary representation of $$\left\lfloor \frac{\iota}{\Delta} \right\rfloor$$

and the input to multiplier (1112) should be $$T = \iota - \left\lfloor \frac{\iota}{\Delta} \right\rfloor \cdot \Delta$$

(remainder of in division by Δ) where ι is the numerical value of idx.

Some embodiments of the presently disclosed subject matter can implement multiplier (1112) in a manner using an LFSR (similar to the LFSR described hereinabove with reference to FIG. 4), such that the π(0:(n−k−1)) value is loaded to an LFSR registers array ("REG $x^i$" for i∈[n−k]_) and then the circuit undergoes T clock-cycles (with input v=0) to achieve $x^T$ multiplication (modulo g(x)).

Some embodiments of the presently disclosed subject matter can implement multiplier (1112) in a manner similar to the system shown hereinabove with reference to FIG. 5. By loading a registers array, setting the input to zero and performing $$\left\lfloor \frac{T}{\ell} \right\rfloor$$

clock cycles in which s=1 (510). If $$T - \ell \cdot \left\lfloor \frac{T}{\ell} \right\rfloor > 0$$

and an additional clock cycle in which $$s = T - \ell \cdot \left\lfloor \frac{T}{\ell} \right\rfloor$$

(the remainder of T in division by l). In such cases, multiple clock-cycles can be required to calculate the output (1116). As such an additional ready signal output (not shown) can be included in multiplier (1112), that signals 1 only if multiplier output (1116) is ready.

Figure 12:
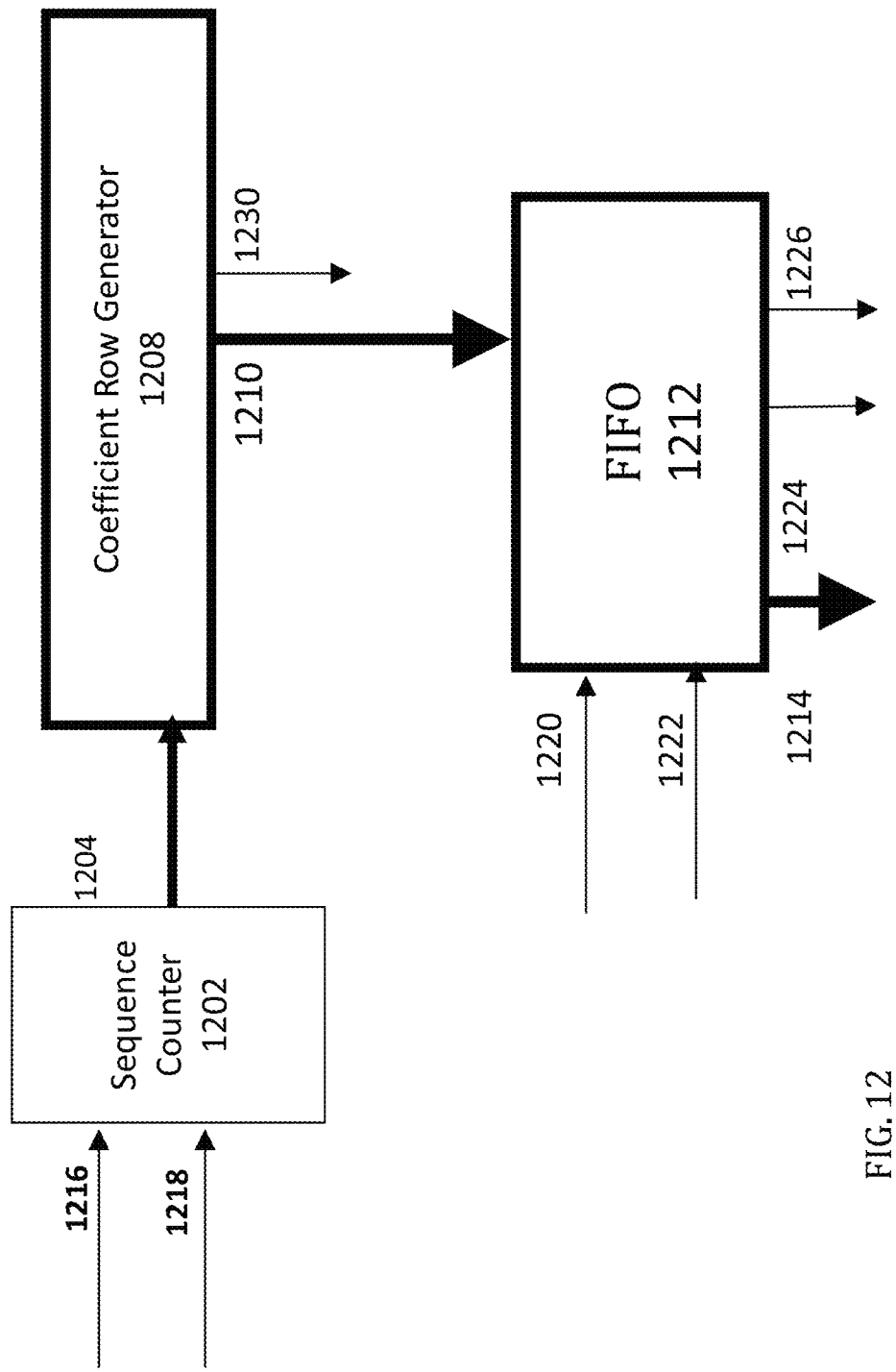
FIG. 12, illustrates an exemplary structure utilizing coefficient row generator according to some embodiments of the presently disclosed subject matter.

Attention is now drawn to FIG. 12, which illustrates an exemplary structure utilizing coefficient row generator (702) according to some embodiments of the presently disclosed subject matter.

In this case, coefficient row generator (1208) can be controlled by row index input (1204). Row index input (1204), in turn, can be generated by sequence counter (1202) which can output the permutation sequence of the information symbols, e.g. in some embodiments of the presently disclosed subject matter it outputs the sequence θ(i) such that $v_{\theta(i)}$ is the sequence of information symbols.

Coefficient row generator (1208) can generate the matrix row coefficients (1210) corresponding to the row index input (1204), and these can then be stored in FIFO (first-in-first-out) (1212). Thus, FIFO (1212) can contain the rows of P that would be used by potential next invocations (i.e. the rows corresponding to row indices that may be used next).

When the processing circuitry (for example: controller (235 or 335)) receives an information symbol, it can use the read input signal (1222) to indicates that a next row is needed. If that row already exists in FIFO (1212), then it can be output on the FIFO output signal (1214) and FIFO output ready signal (1224) can indicate that it is available.

A row that was read can be deleted from the FIFO (1212), thereby making room for the next row.

A sequence counter advance input signal (1216) and a FIFO full indicator output signal (1226) can, for example, be utilized to ensure that when possible (i.e. FIFO is not full) new entry from Coefficient row generator (1208) may be stored in FIFO.

There can be a write input signal (1220) which can be used for storing new rows. There can be row ready signal (1230) which indicates when the value of matrix row coefficients (1210) are valid. It is noted that coefficient row generator (1208) can, in some embodiments of the presently disclosed subject matter, require several clock-cycles for generating a single row (e.g. if several latches are introduced to support shorter clock frequency).

By way of non-limiting example: the following pseudo-code technique may be utilized to ensure that the FIFO (1212) is full:
reset the counter
as long as FIFO.full !=0 (1226)//fifo is not full
    If CoefficientRowGenerator.ready=1 (1230)
        FIFO.write=1 (1220)//write current row
        SequenceCounter.advance=1 (1216)//advance counter
    Otherwise
        FIFO.write=0 (1220)//do not write
        Sequence_Counter.advance=0 (1216)//do not advance counter In other words, the FIFO is filled whenever possible, such that results read from it may not have to wait for Coefficient Row Generator (1208) to finish. This can be beneficial if between calculation of parity there are other operations, thus the FIG. 12 system can operate in parallel to such operations. By way of non-limiting example, this can for example be done in the case of a sequential decoding operation, as illustrated by the following steps:
Initialize a parity vector $\hat{p}_0^{n-k-1}$ to be the all-zeros vector.
Initialize the registers array "REG x'" to be the all-zeros vector.
For each l∈[n−k]_,
    If $\tilde{v}_l$ is an information symbol $u_{i'}$:
        Set FIFO.read=1 input (1222);
        When FIFO.ready=1 (1224) the FIFO outputs [$P_{i,0}$, $P_{i,1}$, ... $P_{i,n-k-1}$], where i=k−1−i'.
        Set input symbol to $u_{i'}$
        Output $u_{i'}$.
        FIFO.read=0;
    If $\tilde{v}_l$ is parity symbol $p_i$:
        Store $\tilde{v}_l$ in $\hat{p}_i$.

In some embodiments of the presently disclosed subject matter, Coefficient Row Generator (1208) can require several cycles to compute a row, and the FIFO mechanism can reduce the latency of the system.

Figure 12A:
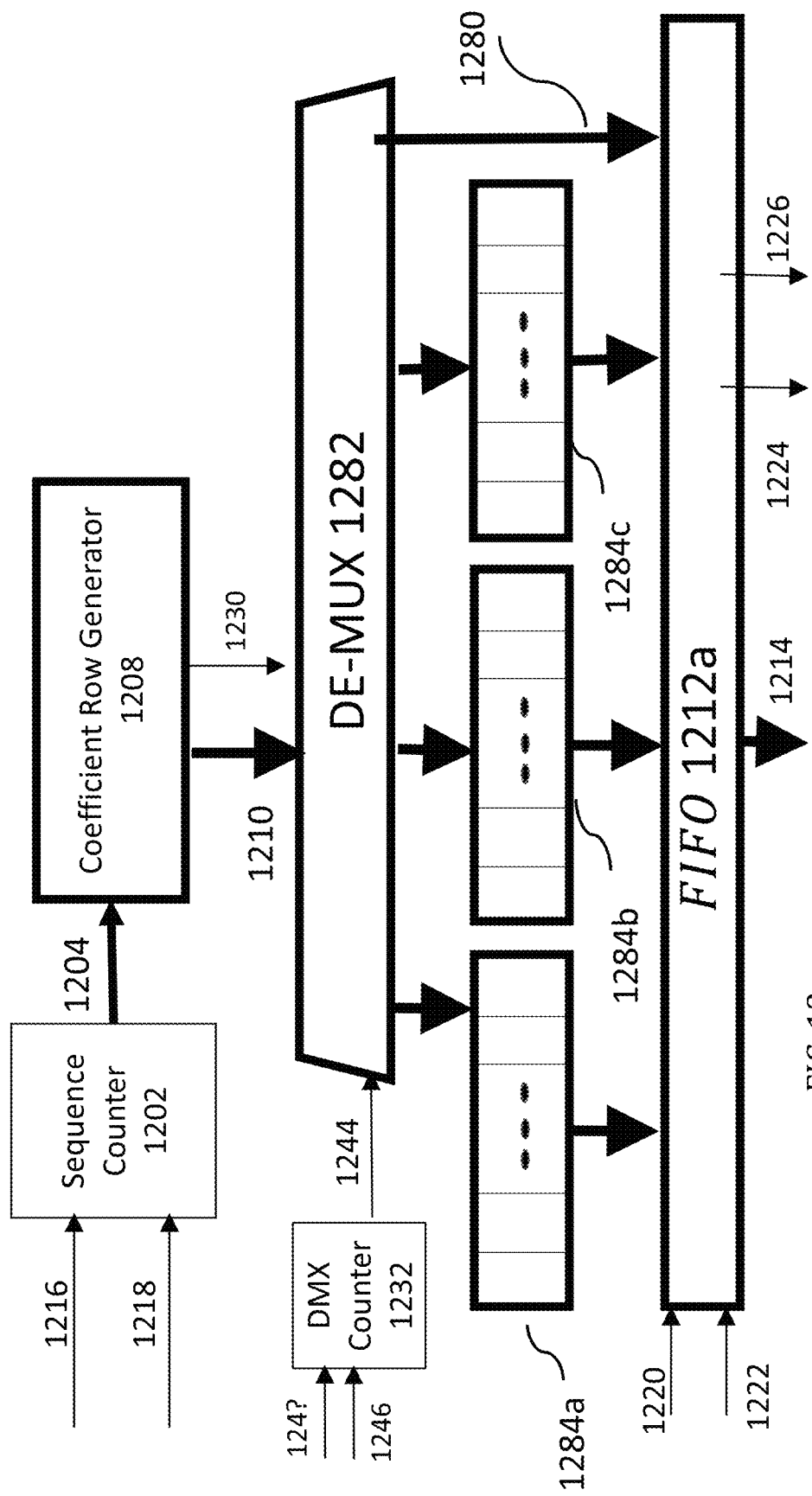
FIG. 12a illustrates an exemplary structure utilizing coefficient row generator according to some embodiments of the presently disclosed subject matter.

Attention is now drawn to FIG. 12a which illustrates an exemplary structure utilizing coefficient row generator (702) according to some embodiments of the presently disclosed subject matter.

In this case there is a rows generation system in which the FIFO outputs results in groups of 4. Employing such a system may enable us to process plurality of input information symbols simultaneously.

Each row of the FIFO (1212a) includes four such P-rows. As a consequence DE-MUX (1282) and registers (1284a, 1284b and 1284c) act as a Serial to Parallel (S/P) unit that concatenate the outputs of coefficient row generator (1208) into sub-sets of 4.

When data is ready on coefficient row generator output (1208), DE-MUX (1242) can route the data to be stored in one of the registers (1284a, 1284b and 1284c) or routed to wire (1240). The routing operation can be controlled by DMX-Counter (1232). When input to DE-MUX 1244 is, for example, 0, 1, 2 and 3, it may direct its input 1210 to registers (1284a, 1284b and 1284c) and to wire (1240) respectively. The control input (1244) is generated by DMX-Counter (1232) which can be a modulo-4 counter.

By way of non-limiting example, the following technique can be used to make sure that FIFO (1212a) is full:
reset the sequence counter (1202) and DMX_Counter (1232)
as long as FIFO.full !=0 (1226)//FIFO is not full
    If CoefficientRowGenerator.ready=1 (1230)
        If dmxCounter=3

FIFO.write=1 (1220)//write current input to the FIFO
Else
   FIFO.write=0 (1220)//do not write current row
   Write register 1284a or 1284b or 1284c if dmx-Counter==0 or 1 or 2, respectively.
   Sequence_Counter.advance=1 (1216)//advance sequence counter
   DMX_Counter.advance=1 (1246)//advance mux counter
Otherwise
   FIFO.write=0 (1220)//do not write
   Sequence_Counter.advance=0 (1216)//do not advance counter
   DMX_Counter.advance=0 (1246)//do not advance mux counter Attention is drawn to FIG. 13 which illustrates a generalized flow diagram of a method of an exemplary method for early calculation of parity symbols of a linear cyclic or shortened linear cyclic code, from a permutation of information symbols, according to some embodiments of the presently disclosed subject matter.

Certain permutations of information symbols have the property that the relative order of the symbols from within the original sequence has been maintained i.e. in the original sequence the first symbol of the segment appears before the second symbol of the segment etc.

Such permutations are herein referred to as stable order permutations.

A sequence of information symbols from a stable order permutation is referred to as an information symbol segment. In some embodiments of the presently disclosed subject matter, and encoder can perform interleaved transmission of the information symbol permutation and the parity. In this case, the transmission of an information symbol segment is immediately followed by the transmission of one or more parity symbols which depend only on information symbols that have already been transmitted.

Any information symbol segment of a stable order permutation may be described by its corresponding difference sequence. Specifically: a segment consisting of a given series of symbols $u_{i_0}, u_{i_1}, \ldots, u_{i_{l-1}}$, p (where $i_0$ denotes the original pre-permutation position of the first symbol of the segment) can be described using the indices of its information symbols as in the following sequence $d_0=i_0$, $d_1=i_1-i_0, \ldots, d_{l-1}=i_{l-1}-i_{l-2}$, $d_l=k-1-i_{l-1}$ (where k is the information length).

It is noted that $d_i>0$ for $0 \leq i \leq l-1$ and $d_l \geq 0$. For such a difference sequence $\Delta_m = \max_{i \in [l+1]} d_i$.

The term "sparse information symbol vector" corresponding to a segment hereforward refers to the sequence $[O^{d_0}, u_{i_0}, O^{d_1}, u_{i_1}, \ldots, O^{d_{l-1}}, u_{i_{l-1}}, O^{d_l}]$, where $O^i$ is the all zeros-vector of length i and $u_{i_0}, u_{i_1}, \ldots, u_{i_{l-1}}$ are the information symbols of the segment. In other words, a sparse information symbol vector is identical to an original information vector u in which each symbol that does not appear in the segment has been replaced with a zero.

The term "contribution" of a segment hereforward refers to the parity computed (according to the particular linear cyclic code being implemented) on the sparse information symbol vector corresponding to the segment.

In some embodiments of the presently disclosed subject matter, parity of a segment can be computed by calculating the contribution of the segment and adding it to the sum of the contributions of the previous segments.

Formally:
Define $p^{(0)}, p^{(1)}, \ldots, p^{(m-1)}$ as the contributions of segments $0, 1, \ldots, m-1$ respectively in a sequence of segments.
For linear cyclic codes (or shortened cyclic codes):
   The parity corresponding to u is $p^{(0)}+p^{(1)}+ \ldots +p^{(m-1)}$
   If the parity symbol corresponding to segment l−1 is $p_h$ and $q=p^{(0)}+p^{(1)}+\ldots+p^{(l-1)}$, then $p_h=q_h$ (i.e. $q_h$ is the final value of the parity corresponding to the segment).

Figure 13:
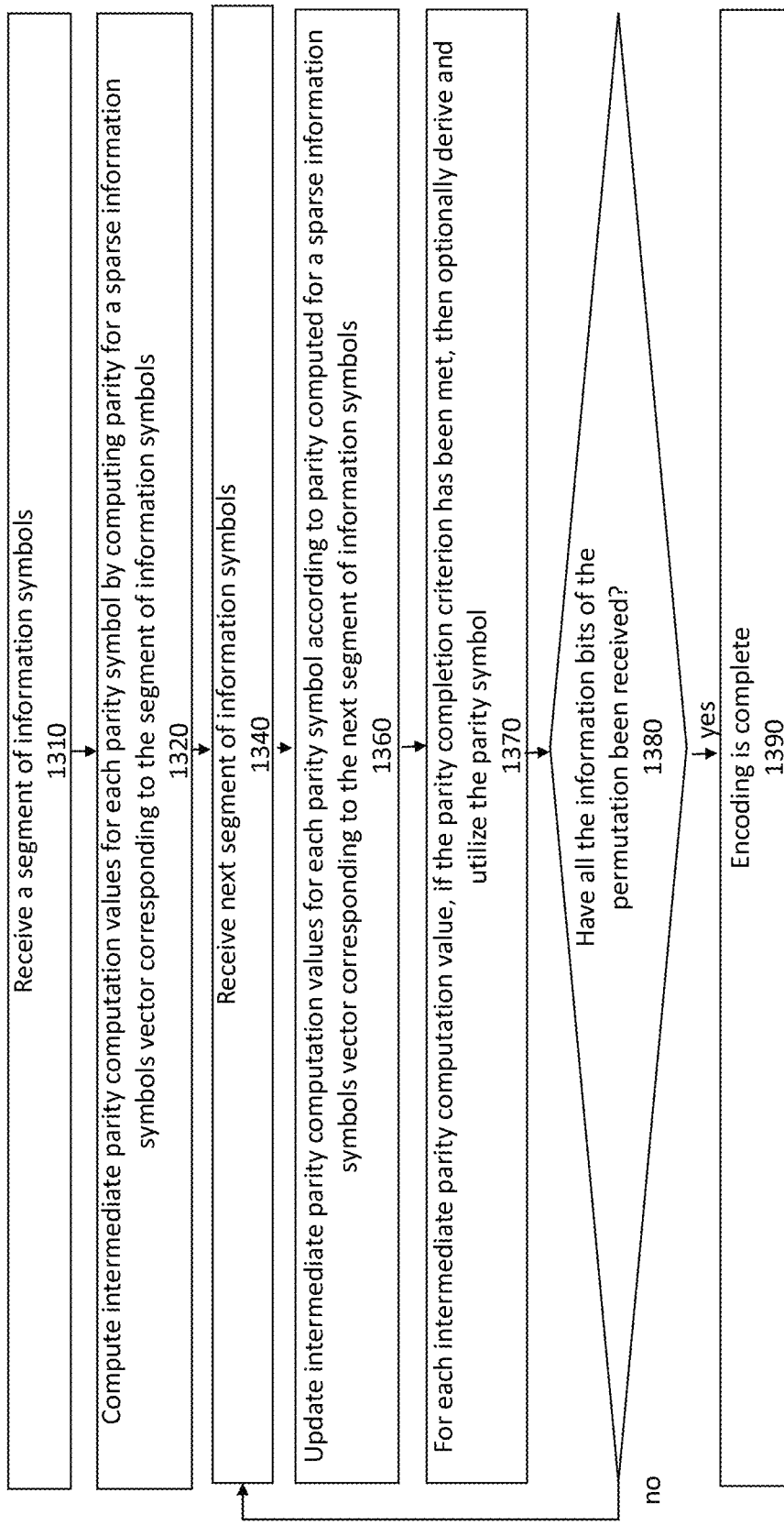
FIG. 13 illustrates a generalized flow diagram of a method of an exemplary method for early calculation of parity symbols of a linear cyclic or shortened linear cyclic code, from a permutation of information symbols, according to some embodiments of the presently disclosed subject matter.

The method of FIG. 13 can be executed using the processing circuitry (205 or 305) (for example: the parity calculation circuitry (235 or 335) as controlled by controller unit (210 or 310)), or on another suitable system.

To begin, the processing circuitry (205 or 305) (for example: the parity calculation circuitry (235 or 335)) can receive (1310) a segment of information symbols from the permutation of the original sequence of information symbols. In some embodiments of the presently disclosed subject matter, the segment consists of a series of information symbols in which each the relative order of the symbols from within the original sequence has been maintained i.e. in the original sequence the first symbol of the segment appears before the second symbol of the segment etc.

Next, the processing circuitry (205 or 305) (for example: the parity calculation circuitry (235 or 335)) can generate (1320) a sparse information symbol vector from the segment of information symbols. The structure of a sparse information symbol vector corresponding to a segment of information symbols is described hereinabove.

Next, the processing circuitry (205 or 305) (for example: the parity calculation circuitry (235 or 335)) can compute (1320) linear cyclic code parity for a sparse information symbol vector corresponding to the segment of information symbols. The resulting parity symbol values can constitute, for example, an initial value for accumulating parity, as described hereinbelow. In some embodiments of the presently disclosed subject matter, parity calculation circuitry (235 or 335) can compute parity of a sparse information symbol vector corresponding to the segment of information symbols using, for example, the system described below with reference to FIG. 14 or for example, a suitable system performing a method similar to the one described hereinbelow with reference to FIG. 14. In some embodiments of the presently disclosed subject matter, controller unit (210 or 310) sequentially supplies each symbol and its symbol index difference (i.e. the difference between the symbol index of the current symbol and the symbol index of the previous symbol) to the parity calculation circuit (235 or 335), as described below with reference to FIG. 14. In some embodiments of the presently disclosed subject matter, processing circuitry (205 or 305) (for example: controller unit (210 or 310)) can use the newly computed parity to set initial intermediate parity values (for example by storing the newly computed parity symbols to memory).

Next, the processing circuitry (205 or 305) (for example: the parity calculation circuitry (235 or 335)) can receive (1340) a next segment of information symbols from the permutation of the original sequence of information symbols. In some embodiments of the presently disclosed subject matter, the segment consists of a sequence of information symbols in which each relative order of the symbols from within the original sequence has been maintained i.e. in the original sequence the first symbol of the segment appears before the second symbol of the segment etc.

Next, the processing circuitry (205 or 305) (for example: the parity calculation circuitry (235 or 335)) can compute (1360) linear cyclic code parity for a sparse information symbol vector corresponding to the new segment of information symbols. In some embodiments of the presently disclosed subject matter, parity calculation circuitry (235 or 335) can compute parity of the sparse information symbol vector as described below with reference to FIG. 14. The processing circuitry (205 or 305) (for example: controller unit (210 or 310)) can use the newly computed parity to update the intermediate parity values (for example by adding the newly computed parity symbols to the accumulated sum of parity symbols).

Next, the processing circuitry (205 or 305) (for example: the parity calculation circuitry (235 or 335)) can evaluate if a parity completion criterion has been met for any of the parity symbols, and if so it can derive (1370) and optionally utilize the parity symbol.

Figure 14:
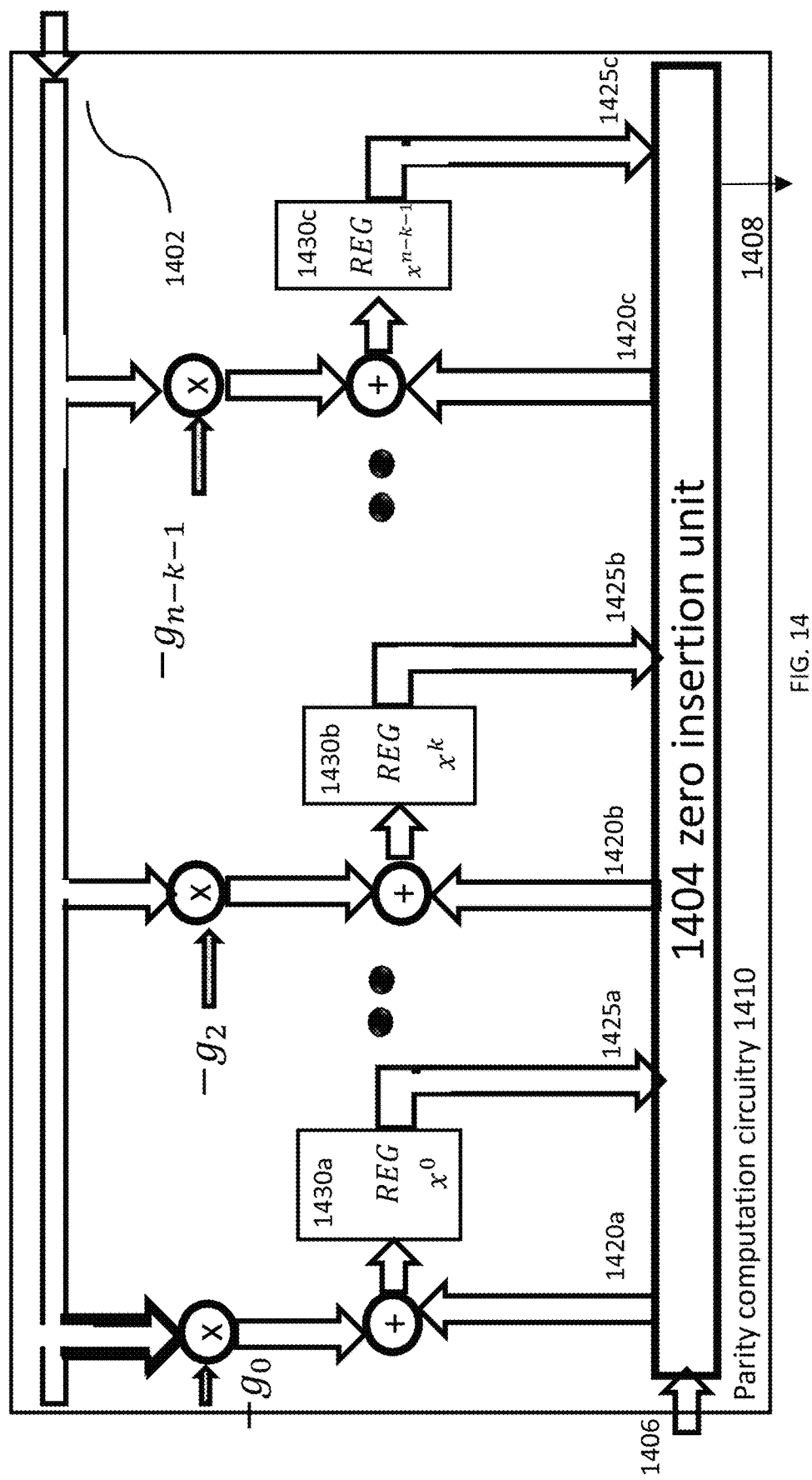
FIG. 14 illustrates an exemplary structure of a parity computation circuitry, in accordance with some embodiments of the presently disclosed subject matter.

It is recalled that the parity completion criterion for a particular parity symbol p refers to a condition wherein all input information symbols û which affect parity symbol p have been processed by the parity computation circuitry (235 or 335). In the context of FIGS. 13-14, the parity completion criterion is regarded as satisfied if, for example, each of the input information symbols û which affect parity symbol p has been included in a sparse information symbol vector that has had parity calculated and accumulated.

Derivation of the parity symbol can be accomplished by, for example, utilizing the accumulated value corresponding to the parity symbol.

The derived parity symbol can be utilized by, for example, for: transmitting the parity symbol, comparing it to a received parity symbol for validation of one or more information symbols, or for correcting one or more information symbols.

Next, the processing circuitry (205 or 305) (for example: the parity calculation circuitry (235 or 335)) can check (1380) whether all the information bits of the permutation have been received. If so, encoding is complete (1390). Otherwise, the processing circuitry (205 or 305) (for example: the parity calculation circuitry (235 or 335)) can receive (1340) a next segment of information symbols from the permutation of the original sequence of information symbols.

It is noted that the teachings of the presently disclosed subject matter are not bound by the flow chart illustrated in FIG. 13, the illustrated operations can occur out of the illustrated order. For example, operations 1320 and 1340 shown in succession can be executed substantially concurrently or in the reverse order. It is also noted that whilst the flow chart is described with reference to elements of ECC decoder (200), this is by no means binding, and the operations can be performed by elements other than those described herein.

Attention is drawn to FIG. 14 which illustrates an exemplary structure of the parity computation circuitry (335), in accordance with some embodiments of the presently disclosed subject matter. The system illustrated in FIG. 14 is, in some embodiments of the presently disclosed subject matter, adapted for computing a contribution of a segment. The system illustrated in FIG. 14 can, for example, be utilized by other components of the processing circuitry (205 or 305) for ongoing computation of parity, as described hereinbelow.

The parity computation circuitry (1410) can receive an input information symbol signal (1402). In some embodiments of the presently disclosed subject matter, the parity computation circuitry (1410) can consecutively receive the values $u_{i_0}, u_{i_1}, \ldots u_{i_{l-1}}$ over the input information symbol signal (1402).

The parity computation circuitry (1410) can receive a subsequence size input signal (1406). In some embodiments of the presently disclosed subject matter, the parity computation circuitry (1410) can utilize the subsequence size input signal (1406) to control the number of zeros inserted into the sparse information symbol vector following the current input symbol. The subsequence size input signal can also be referred to as the information symbol difference index—as it indicates the difference between the information symbol index and the index of the information symbol, that follows it. The parity computation circuitry (1410) can include zero insertion unit (1404) that, for example, inserts zeros to register inputs (1420a, 1420b, and 1420c) as required. Possible implementations of zero insertion unit (1404) are described hereinbelow with reference to FIGS. 15-16.

The parity computation circuitry (1410) can include parity computation registers (for example 1430, 1430b, and 1430c) in an LFSR mechanism comparable to the LFSR described hereinabove, with reference to FIG. 4. In parity computation circuitry (1410), however, rather than each register output providing input to the adder preceding the next register, the register output is instead, in some embodiments of the presently disclosed subject matter, received by zero insertion unit (1404), which in turn provides the input to the next register in accordance with the number of zeros indicated by subsequence size input signal (1406).

By way of non-limiting example, the parity computation circuitry (1410) can compute a contribution, based on input provided by, for example a controller unit (235 or 335) according to the following steps (assuming registers are all initialized to zero):

a) Receive the first IS on the input signal (1402)
b) Store input signal value to registers (1430a, 1430b, 1430c etc.)
c) Receive the subsequence size (IS index difference) on the subsequence size input signal (1406)
d) Receive the next IS on the input signal (1402)
e) Wait for ready signal (1408) from zero insertion unit (1404) and store input signal value to registers (1430a, 1430b, 1430c etc.)
f) Repeat operations c-e for all remaining IS in the segment
g) Receive a final 0 on the input signal (1402)
h) Wait for ready signal (1408) from zero insertion unit (1404) and store input signal value to registers (1430a, 1430b, 1430c etc.)

The parity computation circuitry (1410) can, for example, generate a ready output signal (1408). In some embodiments of the presently disclosed subject matter, the parity computation circuitry (1410) can set the ready output signal (1408) in order to indicate that the generation of the contribution of the segment is completed.

The sequence output can fulfill $p(x)=R_{g(x)}[r(x) \cdot x^d]$

The contribution of the segment can, for example, appear on the the register outputs (1425a, 1425b, and 1425c).

It is noted that the teachings of the presently disclosed subject matter are not bound by the parity calculation circuitry described with reference to FIG. 14. Equivalent and/or modified functionality can be consolidated or divided in another manner and can be implemented in any appropriate combination of software with firmware and/or hardware and executed on a suitable device. The parity calculation circuitry can be a standalone network entity, or integrated, fully or partly, with other entities. It will be clear to one skilled in the art how parity calculation circuitry can be employed in other embodiments.

Figure 15:
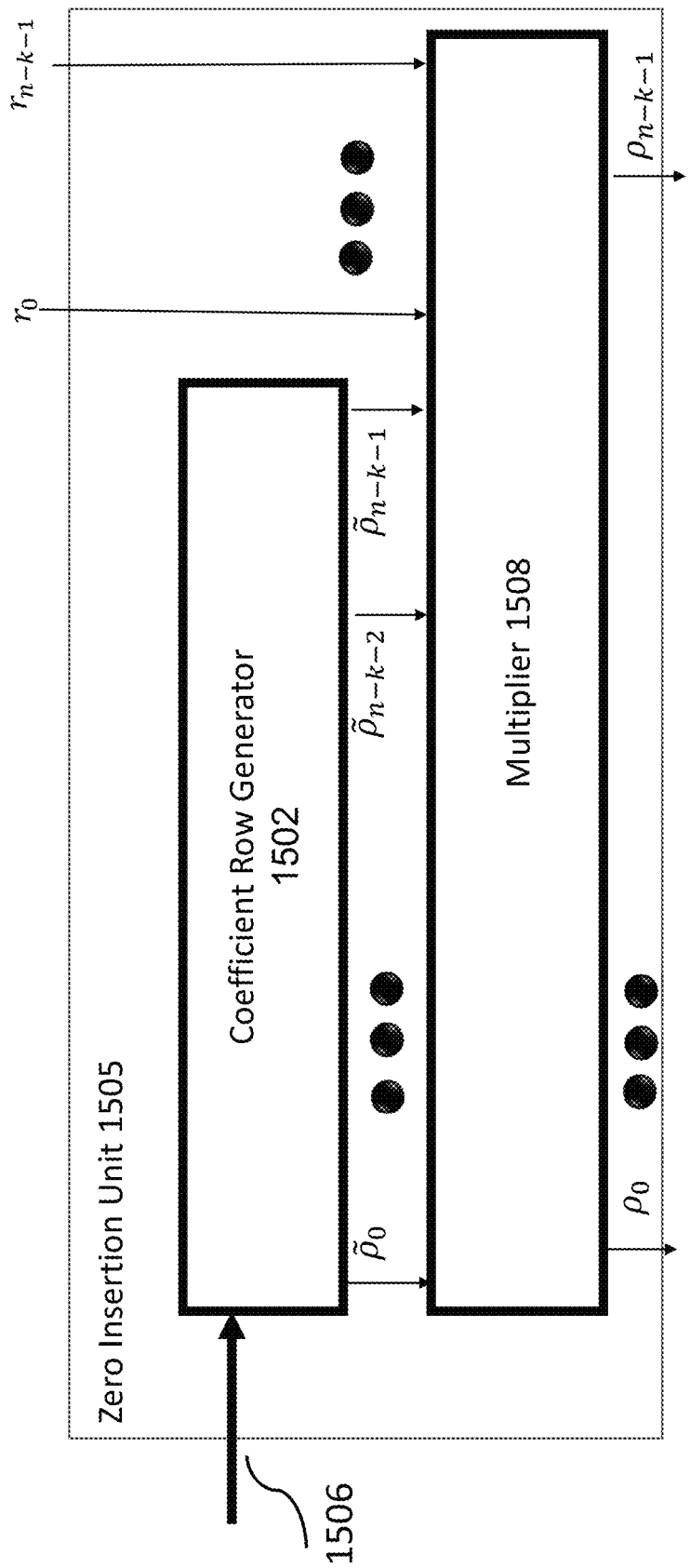
FIG. 15 illustrates an exemplary implementation of a zero insertion unit, according to some embodiments of the presently disclosed subject matter.

Attention is drawn to FIG. 15 which illustrates an exemplary implementation of zero insertion unit (1404), according to some embodiments of the presently disclosed subject matter. Zero insertion unit (1505) can include, for example, a coefficient row generator (1502). Coefficient row generator (1502) can, for example, generate row coefficients in a manner similar to the Coefficient Row Generator (702) described hereinabove with reference to FIGS. 7 and 10. However in this case the output of Coefficient Row Generator (1502) is $R_{g(x)}[x^i]$ (rather than $R_{g(x)}[x^{n-k+i}]$ as in FIG. 7).

The output of Coefficient Row Generator (1502) can be multiplied with input $r_0^{n-k-1}$ using the multiplier (1508). It is noted that inputs $r_0^{n-k-1}$ correspond to zero insertion unit (1404) inputs (1425a, 1425b, 1425c) and that subsequence size input (1506) corresponds to zero insertion unit (1404) subsequence size (1406).

It is noted that there may be two sources of delay within the zero insertion unit (1505):
  Delay I: Generating $\tilde{\rho}$ by coefficient row generator (1502)
  Delay II: Multiplication in the multiplier (1508).

In some embodiments of the presently disclosed subject matter, pre-computed outputs can be implemented in coefficient row generator (1502) to avoid Delay I in generation of $\tilde{\rho}$ for those outputs. Temporary memory (e.g. cache memory) can, for example, be used to store previous values of the circuit. By employing appropriate cache storage mechanism (e.g. Least Recently Used, LRU) it is, for example, possible to mitigate delays for frequently repeating outputs.

Figure 16A:
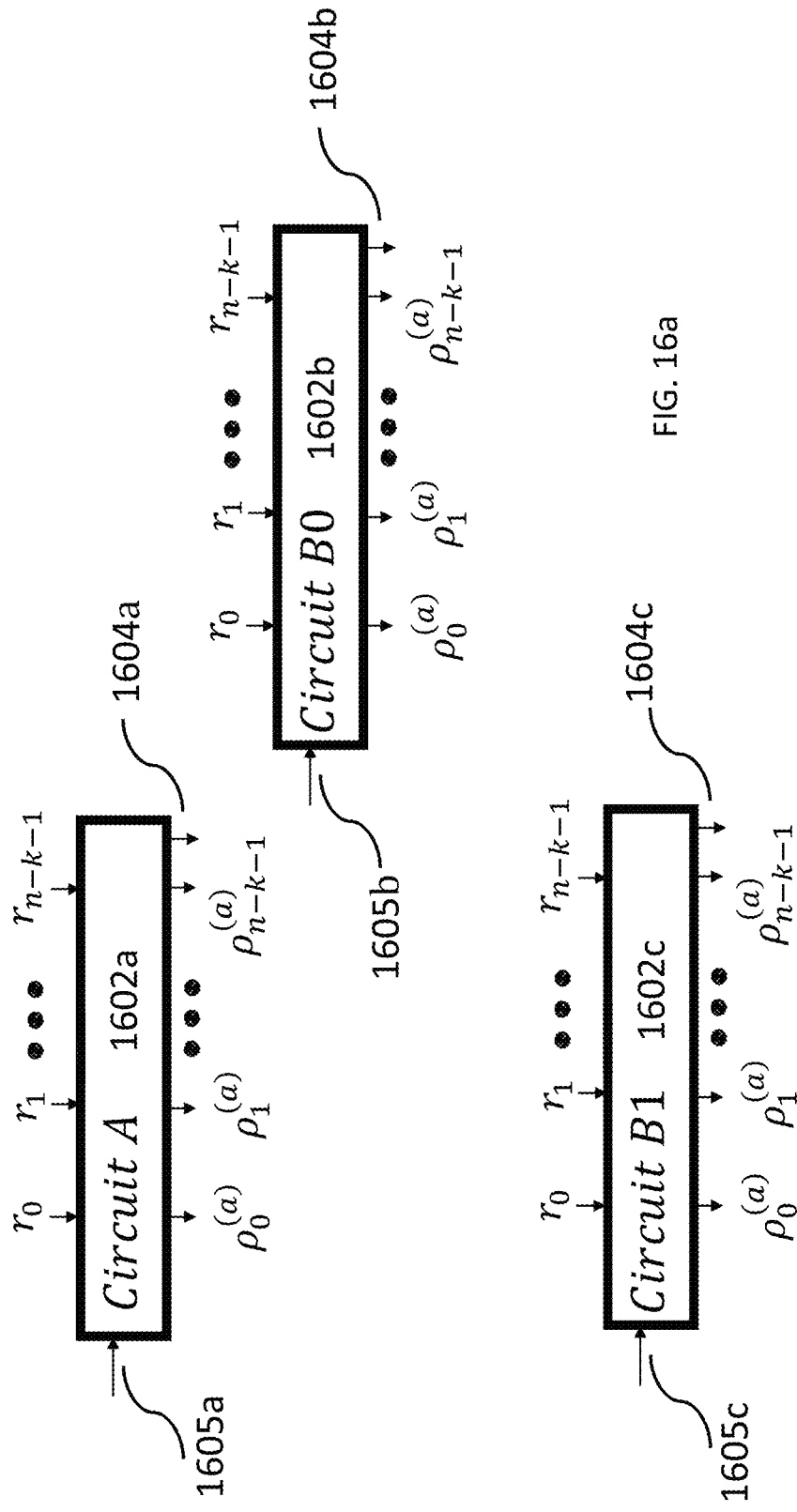
FIG. 16a-16b illustrates another exemplary implementation of a zero insertion unit according to some embodiments of the presently disclosed subject matter.
Figure 16B:
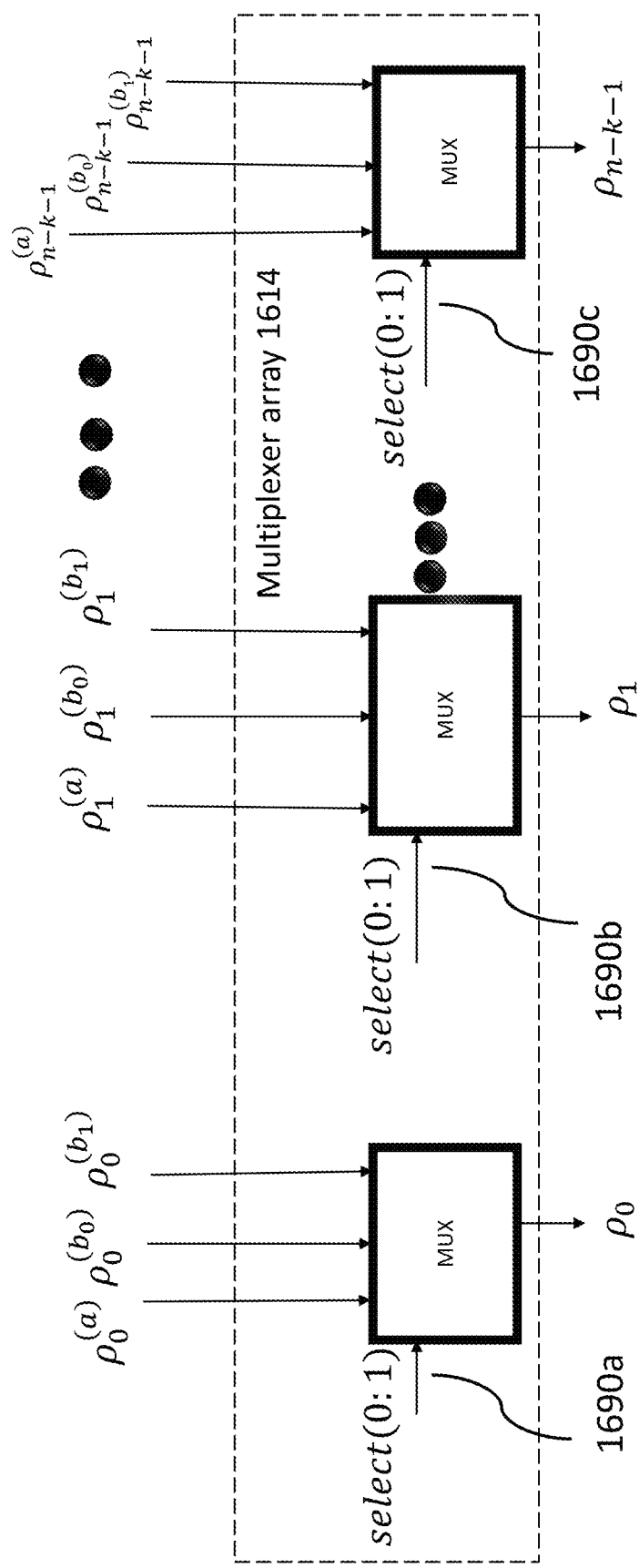

Attention is drawn to FIG. 16 that illustrates another exemplary implementation of zero insertion unit 1404 according to some embodiments of the presently disclosed subject matter.

In some embodiments of the presently disclosed subject matter, there can be multiple implementations of the zero insertion unit (1404)—with the different implementations being optimized for particular index differences. In such embodiments, the zero insertion unit (1404) can utilize a multiplexer and control unit (as described hereinbelow with reference to FIG. 16b), to select which implementation to use for a particular IS in the IS segment.

By way of non-limiting example, Circuit A (1602a) can be a basic implementation for the circuit which is defined to require T clock cycles to complete. Circuits B0 and B1 (1602b and 1602c) can each implement a multiplication by a pre-defined and constant polynomial (modulo g(x))—and thus be optimized for a particular index difference which might be frequently used in a particular implementation. Specifically, in this example there is multiplication by $x$, $x^2$ and $x^5$ in circuits A, B0, B1 (1602a, 1602b, and 1602c) respectively. These can thus be optimized by index differences of 1, 2, and 5 respectively.

Multiplexer array 1614 can select the output of the system $\rho^{n-k-1}$ according to the outputs of the internal circuits (e.g. circuit A, B0, B1 and B2). The behavior of the circuit can be controlled by, for example, a multiplexer control unit (not shown) which can select circuit output by setting the bits of select(0:1) input signal (1690a, 1690b, 1690c) and can also produce the output ready signal (1618). B-type circuits can have better delay characteristics, and consequently can be used instead of circuit A implementation to reduce Delay II. The multiplexer control unit can select the computation block that minimizes the computing delay.

In some embodiments of the presently disclosed subject matter, the internal circuits can be iteratively invoked several times before a result is output. For example, $R_{g(x)}[x^4 r(x)]$ may be computed by setting $\tilde{\rho}(x) = R_{g(x)}[x^2 r(x)]$ on the first clock-cycle using Circuit B1 (1608) and then employing Circuit B1 (1608) again on $p(x)$ in the second clock-cycle, i.e. calculating $p(x) = R_{g(x)}[x^2 \tilde{\rho}(x)]$. By introducing an additional temporary register for storing $$\tilde{\rho}_0^{n-k-1}$$

and routing this register value back to the internal circuits (for exampling by introducing multiplexers between registers $$\tilde{\rho}_0^{n-k-1}$$

and $$r_0^{n-k-1}$$

at the input to circuits A, B0, B1 and B2 (1602, 1606, 1608, and 1610)) it is possible to support such an iterative approach. The control unit (1612) can manage such an iterative approach, selecting the best computation path that minimizes latency.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined in and by the appended claims.

The invention claimed is:

1. A computerized method of calculating one or more parity symbols of an encoding of information symbols according to a linear cyclic code, the method comprising:
  a. upon obtaining a first information symbol (IS) of a permutation of information symbols, each IS of the permutation being associated with an IS index,
    generating, by a processing circuitry, data indicative of one or more parity coefficients of a row of a generator matrix associated with the linear cyclic code, the row corresponding to an IS index associated with the first IS;

b. computing, by the processing circuitry, for each given parity coefficient of the one or more parity coefficients:
   a per-coefficient intermediate parity value in accordance with, at least, the respective parity coefficient and the first IS; and
c. for each of one or more subsequent information symbols of the permutation,
   generating, by the processing circuitry, data indicative of one or more parity coefficients of a generator matrix row, the row corresponding to an IS index associated with the respective IS, and;
   updating, by the processing circuitry, for each parity coefficient of the one or more parity coefficients of the generator matrix row corresponding to the IS index associated with the respective IS, the respective per-coefficient intermediate parity value,
      the updating being in accordance with, at least, the respective parity coefficient and the respective IS;
      thereby, upon fulfillment of a parity completion criterion of a parity coefficient, giving rise to data indicative of a parity symbol of the encoding of information symbols according to the linear cyclic code.

2. The method of claim 1, additionally comprising:
d. subsequent to fulfillment of a parity completion criterion of a parity coefficient, thereby giving rise to data indicative of a PS, performing at least one selected from the group of:
   transmitting the PS,
   comparing the PS to a received parity symbol, thereby giving rise to an indication of correctness of information symbols; and
   utilizing the PS to perform error correction.

3. The method of claim 1, wherein the computing a per-coefficient intermediate parity value comprises multiplying the respective IS by the respective parity coefficient.

4. The method of claim 3, wherein the updating the respective per-coefficient intermediate parity value comprises adding, to the respective per-coefficient intermediate parity value, a result of multiplying the respective IS by the respective parity coefficient.

5. The method of claim 1, wherein the permutation comprises information symbols of a candidate codeword, resulting the information symbols being derivative of sequential list decoding of an inner code, the method additionally comprising:
d. subsequent to fulfillment of a parity completion criterion of a parity coefficient, thereby giving rise to data indicative of a PS:
   comparing the PS to a received parity symbol of the linear cyclic code comprised in the information symbols, thereby giving rise to an indication of correctness of the candidate codeword; and
e. according to the indication of correctness of the candidate codeword, performing one selected from the group of: invalidating the candidate codeword, and accepting the candidate codeword.

6. The method of claim 5, wherein the linear cyclic code is a cyclic redundancy check.

7. The method of claim 5, wherein the inner code is a polar code.

8. A decoder configured to calculate one or more parity symbols of an encoding of information symbols according to a linear cyclic code, the decoder comprising a processing circuitry configured to:

a. upon obtaining a first information symbol (IS) of a permutation of information symbols, each IS of the permutation being associated with an IS index,
   generate data indicative of one or more parity coefficients of a row of a generator matrix associated with the linear cyclic code, the row corresponding to an IS index associated with the first IS;
b. compute, for each parity coefficient of the one or more parity coefficients, a per-coefficient intermediate parity value in accordance with, at least, the respective parity coefficient and the first IS; and
c. for each of one or more subsequent information symbols of the permutation,
   generate data indicative of one or more parity coefficients of a generator matrix row, the row corresponding to an IS index associated with the respective IS;
   update, for each parity coefficient of the one or more parity coefficients of the generator matrix row corresponding to the IS index associated with the respective IS, the respective coefficient intermediate parity value, the first data,
      the updating being in accordance with, at least, the respective parity coefficient and the respective IS;
      thereby, upon fulfillment of parity completion criterion of a parity coefficient, giving rise to data indicative of a parity symbol of the encoding of information symbols according to the linear cyclic code.

9. A computer program product comprising a non-transitory computer readable storage medium retaining program instructions, which, when read by a processing circuitry, cause the processing circuitry to perform a computerized method of calculating one or more parity symbols of an encoding of information symbols according to a linear cyclic code, the method comprising:
a. upon obtaining a first information symbol (IS) of a permutation of information symbols, each IS of the permutation being associated with an IS index,
   generating, by a processing circuitry, data indicative of one or more parity coefficients of a row of a generator matrix associated with the linear cyclic code, the row corresponding to an IS index associated with the first IS;
b. computing, by the processing circuitry, for each given parity coefficient of the one or more parity coefficients:
   a per-coefficient intermediate parity value in accordance with, at least, the respective parity coefficient and the first IS; and
c. for each of one or more subsequent information symbols of the permutation,
   generating, by the processing circuitry, data indicative of one or more parity coefficients of a generator matrix row, the row corresponding to the IS index associated with the respective IS;
   updating, by the processing circuitry, for each parity coefficient of the one or more parity coefficients of the generator matrix row corresponding to the IS index associated with the respective IS, the respective coefficient intermediate parity value,
   the updating being in accordance with, at least, the respective parity coefficient and the respective IS;
      thereby, upon fulfillment of parity completion criterion of a parity coefficient, giving rise to data indicative of a parity symbol of the encoding of information symbols according to the linear cyclic code.

* * * * *

UNITED STATES PATENT AND TRADEMARK OFFICE
CERTIFICATE OF CORRECTION

PATENT NO. : 10,866,857 B2
APPLICATION NO. : 16/155538
DATED : December 15, 2020
INVENTOR(S) : Noam Presman et al.

Page 1 of 1

It is certified that error appears in the above-identified patent and that said Letters Patent is hereby corrected as shown below:

In the Claims

At Column 33, Line 45, delete "resulting the information symbols being derivative of" and insert --the information symbols being derivative of--.

At Column 34, Line 21, delete "parity value, the first data," and insert --parity value,--.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*